United States Patent
Schwartz et al.

(10) Patent No.: US 12,216,185 B2
(45) Date of Patent: Feb. 4, 2025

(54) SYSTEMS AND METHODS FOR GENERATION OF HYPERPOLARIZED COMPOUNDS USING PARAHYDROGEN

(71) Applicant: NVISION IMAGING TECHNOLOGIES GMBH, Ulm (DE)

(72) Inventors: Ilai Schwartz, Neu-Ulm (DE); Michael Keim, Neu-Ulm (DE); Stephan Knecht, Stuttgart (DE)

(73) Assignee: NVISION IMAGING TECHNOLOGIES GMBH, Ulm (DE)

( * ) Notice: Subject to any disclaimer, the term of this patent is extended or adjusted under 35 U.S.C. 154(b) by 0 days.

(21) Appl. No.: 18/256,202

(22) PCT Filed: Dec. 7, 2021

(86) PCT No.: PCT/IB2021/000840
§ 371 (c)(1),
(2) Date: Jun. 6, 2023

(87) PCT Pub. No.: WO2022/157534
PCT Pub. Date: Jul. 28, 2022

(65) Prior Publication Data
US 2024/0272252 A1 Aug. 15, 2024

Related U.S. Application Data

(63) Continuation-in-part of application No. PCT/IB2021/000493, filed on Jul. 23, 2021.
(Continued)

(51) Int. Cl.
*G01R 33/31* (2006.01)
*G01R 33/28* (2006.01)
(Continued)

(52) U.S. Cl.
CPC ......... *G01R 33/282* (2013.01); *G01R 33/307* (2013.01); *G01R 33/31* (2013.01); *G01R 33/42* (2013.01); *G01R 33/465* (2013.01)

(58) Field of Classification Search
CPC .... G01R 33/282; G01R 33/307; G01R 33/31; G01R 33/465; G01R 33/42
See application file for complete search history.

(56) References Cited

U.S. PATENT DOCUMENTS

| 7,199,584 B2 * | 4/2007 | Meriles | G01R 33/282 324/300 |
| 2007/0010702 A1 * | 1/2007 | Wang | A61L 31/10 424/422 |

OTHER PUBLICATIONS

Ripka et al. "Hyperpolarized fumarate via parahydrogen" Chem Commun (Camb). Nov. 7, 2018;54(86):12246-12249.
(Continued)

*Primary Examiner* — Jermele M Hollington
*Assistant Examiner* — Taqi R Nasir
(74) *Attorney, Agent, or Firm* — Finnegan, Henderson, Farabow, Garrett & Dunner, LLP

(57) ABSTRACT

Systems and methods are disclosed for increasing a nuclear spin polarization in a target compound. Nuclear spin polarization can be increased by obtaining the target compound or a precursor of the target compound. The target compound or precursor can include a first proton and a second proton sharing a singlet spin order and a third proton coupled at least to one of the first proton or the second proton. A target atom can be coupled to at least the third proton. The precursor can be placed within a mean magnetic field strength below 500 mT. A magnetic resonance (MR) pulse sequence can be applied to the precursor. the MR pulse sequence configured to transfer population from the first and second protons to the target atom, thereby imparting a non-equilibrium nuclear spin polarization of at least 1%, 2%, 5%, 10%, or 20% to the target atom.

20 Claims, 14 Drawing Sheets

Related U.S. Application Data

(60) Provisional application No. 63/201,151, filed on Apr. 15, 2021, provisional application No. 63/122,006, filed on Dec. 7, 2020, provisional application No. 63/076,411, filed on Sep. 10, 2020, provisional application No. 63/055,367, filed on Jul. 23, 2020.

(51) Int. Cl.
*G01R 33/30* (2006.01)
*G01R 33/42* (2006.01)
*G01R 33/465* (2006.01)

(56) References Cited

OTHER PUBLICATIONS

McCormick et al. "More Than 12 % Polarization and 20 Minute Lifetime of $_{15}$N in a Choline Derivative Utilizing Parahydrogen and a Rhodium Nanocatalyst in Water". Angew Chem Int Ed Engl. Aug. 13, 2018;57(33):10692-10696.
Pravdivtsev et al. "RF-SABRE: A Way to Continuous Spin Hyperpolarization at High Magnetic Fields". J Phys Chem B. Oct. 29, 2015;119(43):13619-29.
International Search Report and Written Opinion of the International Searching Authority received in PCT/IB2021/000840, mailed on Jun. 7, 2022 (19 pgs.).

\* cited by examiner

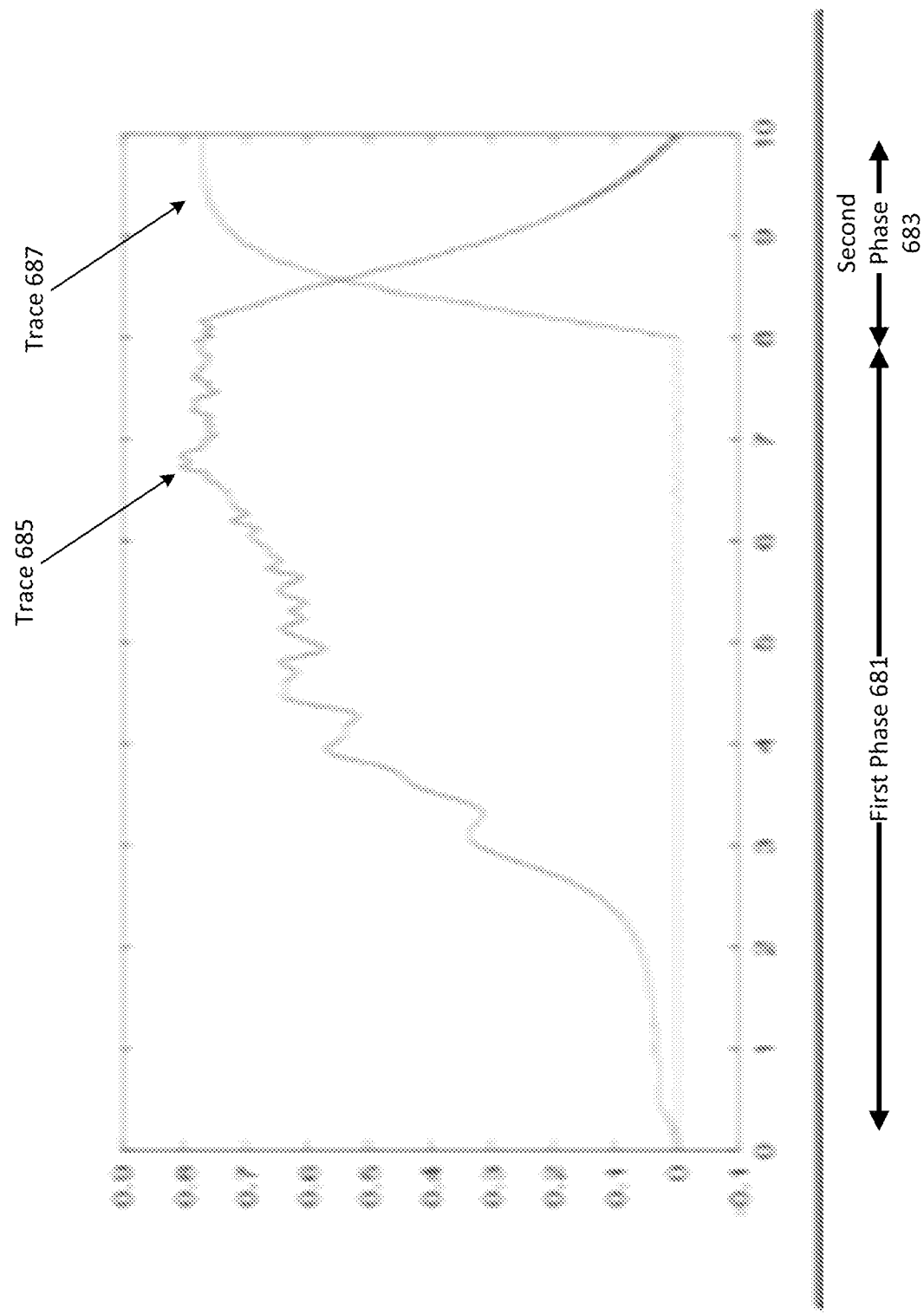

SYSTEMS AND METHODS FOR GENERATION OF HYPERPOLARIZED COMPOUNDS USING PARAHYDROGEN

CROSS-REFERENCE TO RELATED APPLICATIONS

This application is a U.S. national stage entry under 35 U.S.C. § 371 of international application no. PCT/IB2021/000840, filed Dec. 7, 2021, which designates the U.S. and claims the benefit of U.S. Provisional Patent Application No. 63/201,151, filed Apr. 15, 2021. U.S. Provisional Patent Application No. 63/122,006, filed Dec. 7, 2020 and International Application No. PCT/IB2021/000493, filed Jul. 23, 2021, which claims the benefit of U.S. Provisional Application No. 63/055,367, filed Jul. 23, 2020 and U.S. Provisional Application No. 63/076,411, filed Sep. 10, 2020. Each of the above applications is incorporated herein by reference in its entirety.

TECHNICAL FIELD

The disclosed embodiments generally relate to generation of hyperpolarized materials for use in nuclear magnetic resonance, magnetic resonance imaging, or similar applications.

BACKGROUND

Parahydrogen induced polarization (PHIP) is a method for polarizing metabolites for hyperpolarized (HP) Magnetic Resonance Imaging (MRI), with low cost and high throughput. Parahydrogen induced polarization (PHIP), parahydrogen induced polarization with sidearm hydrogenation (PHIP-SAH), and signal amplification by reversible exchanges (SABRE) can be used to polarize metabolites (e.g. fumarate or pyruvate). However, existing polarization approaches may be unsuitable for preclinical or clinical hyperpolarization MRI applications, as such approaches may be unable to achieve a sufficient sample volume, purity, polarization, or concentration.

SUMMARY

The disclosed systems and methods relate to generation of hyperpolarized target compounds using at least one of PHIP, PHIP-SAH, or SABRE. Generation of the hyperpolarized materials can include application of a sequence of microwave pulses or modulation of a magnetic field. In some embodiments, target compound can be hyperpolarized in a solution and then induced to precipitate out of that solution. The precipitate can be redissolved in a specified volume of solvent to form a solution having a desired concentration of the hyperpolarized target compound. Polarization can be transferred from two hydrogen atoms to a spin state of a target atom using a mediating atom that forms a quantum three-body system with the mediating atom.

The disclosed embodiments include a system for generating a hyperpolarized molecule. The system can include a hydrogenation device, a polarization device, an RF waveform generator, and a purification system. The hydrogenation device can be configured to generate a parahydrogenated solution by mixing a solvent, parahydrogen gas, and a precursor of the hyperpolarized molecule, the precursor comprising an unsaturated chemical bond. The polarization device can be configured to generate a polarized solution containing the hyperpolarized molecule using the parahydrogenated solution. The polarization device can include a polarization chamber, one or more radiofrequency (RF) coils, and a magnetic field source. The polarization chamber can be configured to receive the parahydrogenated solution. The polarization chamber can include a polarization region having a volume of at least 10 milliliters (mL). The one or more radiofrequency (RF) coils can be disposed around the polarization region of the polarization chamber. The magnetic field source can be disposed around the polarization region of the polarization chamber and configured to provide a mean magnetic field strength of at most 200 millitesla (mT). The RF waveform generator can be coupled to the one or more RF coils of the polarization device. The RF waveform generator can be configurable to apply an RF waveform to the one or more RF coils. The purification system can be configured to separate a purified fraction from the polarized solution.

The disclosed embodiments include method for increasing a nuclear spin polarization in a target compound. The method can include operations of obtaining a target compound or parahydrogenated precursor of the target compound, placing the target compound or parahydrogenated precursor within a mean magnetic field strength below 500 mT, and applying a magnetic resonance (MR) pulse sequence to the target compound or parahydrogenated precursor. The obtained target compound or parahydrogenated precursor can include (i) a first proton, (ii) a second proton coupled at least to the first proton by a first J-coupling constant, the first and second proton having a singlet spin order, (iii) a third proton coupled at least to one of the first proton or the second proton by a second J-coupling constant, and (iv) a target atom coupled to at least the third proton by a third J-coupling constant. The first and second protons can be separated from the target atom by at least four chemical bonds. The MR pulse sequence can be configured to transfer population from the first and second protons to the target atom, thereby imparting a non-equilibrium nuclear spin polarization of at least 1%, 2%, 5%, 10%, or 20% to the target atom.

The disclosed embodiments further include a method for generating a hyperpolarized molecule. The method can include operations of obtaining a precursor of a molecule, performing a parahydrogen-induced polarization (PHIP) reaction between parahydrogen and the precursor, placing the molecule within a mean magnetic field strength between 0 and 500 mT, applying a magnetic resonance (MR) pulse sequence to the molecule, cleaving the sidearm from the precursor to thereby generate the hyperpolarized molecule and a cleaved sidearm, purifying the hyperpolarized molecule from the cleaved sidearm, administering the hyperpolarized molecule to a subject, and performing a hyperpolarized magnetic resonance imaging (MRI) procedure on the subject. The precursor can include the molecule and a sidearm coupled to the molecule, the molecule comprising a target atom and the sidearm comprising at least one unsaturated chemical bond separated from the target atom by at least three intervening chemical bonds. Performing the parahydrogen-induced polarization (PHIP) reaction can add a first proton and a second proton across the at least one unsaturated bond and forming the molecule. The MR pulse sequence can be configured to transfer population from the first and second protons to the target atom. The MR pulse sequence can thereby impart a non-equilibrium nuclear spin polarization of at least 1%, 2%, 5%, 10%, or 20% to the target atom.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which comprise a part of this specification, illustrate several embodiments and, together with the description, serve to explain the principles and features of the disclosed embodiments. In the drawings:

FIG. 6E depicts $^{13}C$ polarization in planes transverse and parallel to a static magnetic field during application of radiofrequency sweeps in accordance with FIGS. 6B to 6D, consistent with disclosed embodiments.

DETAILED DESCRIPTION

Figure 1:
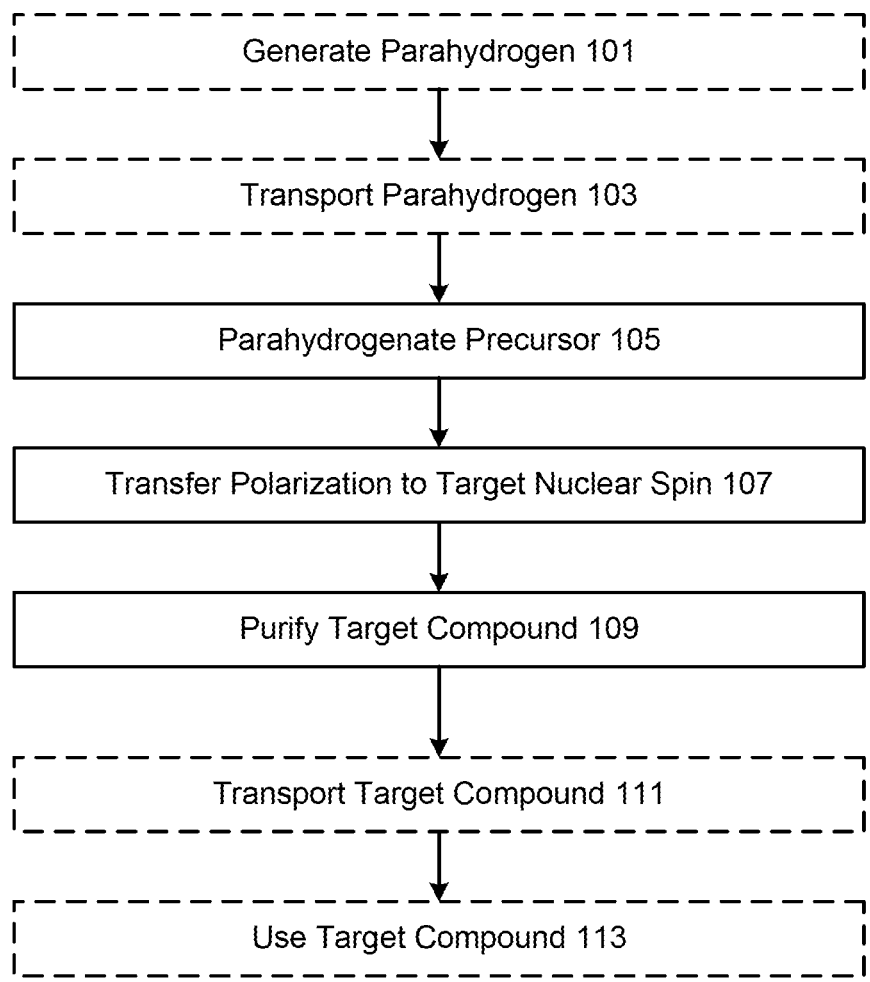
FIG. 1 illustrates an exemplary process for PHIP or PHIP-SAH polarization, consistent with disclosed embodiments.

Reference will now be made in detail to exemplary embodiments, discussed with regard to the accompanying drawings. In some instances, the same reference numbers will be used throughout the drawings and the following description to refer to the same or like parts. Unless otherwise defined, technical or scientific terms have the meaning commonly understood by one of ordinary skill in the art. The disclosed embodiments are described in sufficient detail to enable those skilled in the art to practice the disclosed embodiments. It is to be understood that other embodiments may be utilized and that changes may be made without departing from the scope of the disclosed embodiments. Thus, the materials, methods, and examples are illustrative only and are not intended to be necessarily limiting.

Recent work in the field of nuclear magnetic resonance (NMR) and magnetic resonance imaging (MRI) has demonstrated that NMR and MRI signals associated with a variety of biorelevant imaging agents can be enhanced by many orders of magnitude using a variety of so-called hyperpolarization techniques. Such drastic signal enhancement allows spectroscopic analysis of the biorelevant imaging agent as it is metabolized by various tissues at different locations within a body. Analysis of the metabolic information determined by such spectroscopic imaging may allow non-invasive determination of a health state of tissue within a body. For example, abnormal metabolism of the biorelevant imaging agent may be indicative of a disease such as cancer at some location in the body.

Existing techniques for hyperpolarizing biorelevant imaging agents include dissolution dynamic nuclear polarization (DNP), parahydrogen induced polarization (PHIP), PHIP-sidearm hydrogenation (PHIP-SAH), and signal amplification by reversible exchange (SABRE). However, except for DNP, existing techniques cannot produce clinically relevant volumes and concentrations of biorelevant imaging agents having sufficient polarization and purity. DNP has several drawbacks, including costly instrumentation and long time necessary for polarization buildup.

PHIP-SAH techniques have expanded the utility of PHIP-based polarization methods in the preparation of biorelevant imaging agents. In PHIP-SAH, a precursor molecule is hydrogenated and then cleaved. The precursor molecule generally comprises a sidearm containing an unsaturated chemical bond (such as a carbon-carbon double bond or carbon-carbon triple bond), with the sidearm chemically linked to a biorelevant imaging agent. For instance, the sidearm may be placed on one side of a carboxyl group, such that the sidearm and the biorelevant imaging agent combine to form an ester precursor. The sidearm is then reacted with parahydrogen, which places protons having a high level of spin order across the unsaturated bond. This spin order is then transferred to a target nucleus (such as the nucleus of a 13C target atom) located in the biorelevant imaging agent. The sidearm is then cleaved and removed, allowing formation of a solution containing the biorelevant imaging agent with a hyperpolarized target nucleus.

Unfortunately, previous PHIP-SAH techniques typically require the unsaturated chemical bond to be located no more than two chemical bonds away from the target atom, so that at least one parahydrogen proton ends up within three chemical bonds of the target atom for sufficiently strong coupling. This limitation places major constraints on the precursor, reducing the utility of the PHIP-SAH method. Such prior approaches generally require a tradeoff between the chemical stability of the precursor and the ease with which parahydrogen is added across the unsaturated chemical bond.

Accordingly, there is a need for hyperpolarization methods and systems that utilize PHIP-SAH precursor molecules with unsaturated bonds located at least three chemical bonds away from the target atom, so that each parahydrogen proton ends up at least four chemical bonds away from the target atom, allowing the production of clinically relevant volumes of hyperpolarized biorelevant imaging agents.

The disclosed embodiments include systems and methods for producing target compounds (also referred to as target molecules), such as biorelevant imaging agents, in clinically relevant polarizations, concentrations, volumes and purity.

Disclosed embodiments provide technical improvements in polarizing target compounds in solution. These technical improvements support increases in target compound concentration, the degree of target compound polarization, and increased solution volumes.

The systems and methods described herein utilized PHIP-SAH precursor molecules that contain an unsaturated chemical bond located at least three chemical bonds away from a target atom or nucleus (such as a $^{13}$C target nucleus located on a biorelevant imaging molecule). Parahydrogen is added across the unsaturated chemical bond, such that the two parahydrogen protons are each located at least four chemical bonds away from the target atom or nucleus. Mediating protons located between the parahydrogen protons and the target nucleus form a quantum mechanical spin network that is manipulated to transfer spin order from the parahydrogen protons to the target nucleus, resulting in hyperpolarization of the target nucleus. Radio-frequency (RF) excitation is used to drive this conversion of parahydrogen spin order into target nucleus polarization at easily generated magnetic fields between 0-500 mT. Operating in this regime can enable the scale-up of polarization transfer to clinically relevant volumes. Since the unsaturated chemical bond is located further away from the target nucleus, the precursor molecule is less susceptible to tradeoffs between different optimization parameters such as chemical stability and the ease with which parahydrogen is added across the unsaturated chemical bond. Thus, the precursor molecule can be better optimized to allow the production of clinically relevant volumes of hyperpolarized biorelevant imaging agents such as pyruvate, acetate, other carboxylates and other clinically-relevant target compounds which utilize an unsaturated side-arm for parahydrogen-based polarization.

An electromagnet, with or without a ferromagnetic core, can be used to generate such low magnetic fields in a large volume (e.g., a clinically relevant volume). A magnetic shield can be added to increase homogeneity across the large volume. Accordingly, a greater amount (e.g., a clinically relevant volume) of a more-highly polarized target compound can be produced.

The disclosed embodiments can be used together, or can be used separately. For example, the disclosed technical improvements in polarizing target compounds can be used with the disclosed improved separation methods, or other separation methods. Likewise, the disclosed technical improvements in separating target compounds can be used with the disclosed improved polarization methods, or other polarization methods.

Parahydrogen can be used as a source of polarization, consistent with disclosed embodiments. Parahydrogen, as described herein, is a form of molecular hydrogen in which the two protons spins are in the singlet state. The disclosed embodiments are not limited to a particular method of generating parahydrogen. Parahydrogen may be formed in a gas form or in a liquid form. Parahydrogen may be generated in gas form by flowing hydrogen gas at low temperature (e.g., cryogenic temperatures, such as temperatures between the boiling points of liquid helium and liquid nitrogen) through a chamber with a catalyst (e.g., iron oxide or another suitable catalyst). The hydrogen gas can contain both parahydrogen and orthohydrogen. The low temperature can bring the hydrogen gas to thermodynamic equilibrium in the chamber, increasing the population of parahydrogen. The disclosed embodiments are not limited to a particular parahydrogen generation location. Parahydrogen can be generated at a first location and subsequently transported to a second location for use. In some embodiments, a first location may be a chamber, which may be part of a container, bottle, holder, or other region capable of holding a gas or a liquid. Such a chamber may be maintained at a suitable pressure or temperature. In some embodiments, the first location may refer to a physical location such as a room, a lab, a particular warehouse, hospital, or other location where the parahydrogen may be generated. The disclosed embodiments are not limited to a particular parahydrogen transport method. The generated parahydrogen may be transported in a chamber, which may be different from the chamber where the parahydrogen was generated. The chamber transporting the parahydrogen gas may be maintained at a suitable pressure or temperature, which may be transported by vehicle or persons. Transporting the parahydrogen may involve moving the parahydrogen from one container to a different container. Transporting the parahydrogen may involve moving the parahydrogen within the same location, such as from one part of a room to another part of the room. Transporting the parahydrogen may involve moving the parahydrogen from one room in a building to a different room in the same building or to a nearby building. Transporting the parahydrogen may involve moving the parahydrogen to a different location in another part of the same city, or a different city. Transporting the parahydrogen may involve bringing the parahydrogen to a vicinity of a polarizer or an NMR/MRI device. Transporting the parahydrogen may involve packaging or shipping the parahydrogen in suitable containers.

A population difference between spin states can be the difference between the population of the two spin states divided by the total population of these two spin states. A population difference may be expressed as a fractional population difference or a percentage population difference. In certain embodiments, the fractional population difference is at least about 0.1, 0.2, 0.3, 0.4, 0.5, 0.6, 0.7, 0.8, 0.9, or more. In certain embodiments, the fractional population difference is at most about 0.9, 0.8, 0.7, 0.6, 0.5, 0.4, 0.3, 0.2, 0.1, or less. In certain embodiments, the fractional population difference is within a range defined by any two of the preceding values.

Hydrogen gas can exhibit a population difference between proton spin states greatly exceeding the population difference between proton spin states at thermal equilibrium. Parahydrogen can have a large population difference between the singlet spin state and any of the triplet spin states. In the case of $I_{z1}I_{z2}$ order, achieved for example by hydrogenation at high magnetic fields, there is a large population difference for example between the spin state $|\uparrow>|\downarrow>$ and the spin state $|\uparrow>|\uparrow>$. The population difference in proton spin states can be more than about 0.1 (e.g., a 10% difference in spin states–55% of the parahydrogen molecules in a sample being in the singlet state and 45% in the triplet state), 0.2, 0.3, 0.4, 0.5, 0.6, 0.7, 0.8, 0.9, or more; or can be less than about 0.9, 0.8, 0.7, 0.6, 0.5, 0.4, 0.3, 0.2, 0.1, or less.

Target compounds can include materials suitable for use in NMR or MRI operations (e.g., "NMR materials"). In some embodiments, such an NMR material may increase NMR/MRI signal and signal-to-noise ratio (SNR). In some embodiments, the NMR material can be suitable for use in solution NMR spectroscopy. In some embodiments, the NMR material may be a metabolite (e.g., a molecule with a biological relevance such as an amino acid, a saccharide, a derivative thereof, or the like), such as a metabolite suitable for use in an NMR metabolomics application. In some embodiments, the NMR material may be suitable for in-vitro probing of the metabolism of a cell culture or other biological tissue. In some embodiments, the NMR material may be used in an NMR probe to investigate a transient effect in which high signal enhancement due to hyperpolarization is needed, such as proton exchange between water and biomolecules. In some embodiments, the NMR material can be a small molecule or metabolite suitable for injection into a cell, tissue, or organism for detection in an MRI scan. In some embodiments, the NMR material can be introduced into a chamber for further analysis by NMR or MRI operations. In some embodiments, the NMR material can be enriched with 13C atom(s). In some embodiments the NMR material can be a biocompatible material which does not necessarily have a metabolic function.

Consistent with disclosed embodiments, the target compound can be pyruvate, lactate, bicarbonate, fumarate, urea, alpha-ketoglutarate, dehydroascorbate, glutamate, glutamine, acetate, dihydroxyacetone, acetoacetate, glucose, ascorbate, zymonate, imidazole, nicotinamide, nitroimidazole, pyrazinamide, isoniazid, a conjugate acid of any of the foregoing, natural and unnatural amino acids, esters thereof, or $^{13}C$ or $^{15}N$ enriched versions of any of the foregoing.

Consistent with disclosed embodiments, a target compound can be generated from a "precursor" of the target compound. Such generation can include one or more chemical reactions. In some embodiments, the target compound can be generated from the precursor by hydrogeneration of one or more unsaturated bonds (e.g., unsaturated carbon-carbon bonds) of the precursor. For example, when the target compound is fumarate, one or more unsaturated bonds of acetylenedicarboxylic acid can be hydrogenated to generate fumaric acid. In some embodiments, the target compound can be generated from the precursor by cleaving from the precursor a sidearm to yield the target compound. In some embodiments, the precursor can be an ester, with a generic formula of —COOR. Accordingly, in such embodiments, the term "sidearm" may refer to the R moiety of the ester. In some embodiments, the sidearm may include the substituents and functional groups directly bound to the ester oxygen bound by carbons on both sides. For example, the precursor can be an enol or ynol ester of the target compound, wherein the specific enol or ynol may be referred to as the sidearm. As a further example, the target compound can be pyruvate. When the precursor is vinyl pyruvate and the sidearm is a vinyl functional group. When the precursor is cinnamyl pyruvate, the sidearm is a phenyl allyl functional group. When the precursor is allyl pyruvate, the sidearm is an allyl functional group. When the precursor is propargyl pyruvate, the sidearm is a propargyl functional group. In some embodiments, the target compound can be generated from the precursor by hydrogeneration and cleaving of a sidearm. For example, the precursor can be hydrogenated and the sidearm subsequently cleaved to yield the target compound. The hydrogenation may occur at a location on the sidearm or the target compound.

Consistent with disclosed embodiments, hydrogenation can be performed using parahydrogen (e.g., parahydrogenation). Such parahydrogenation can create a population difference in proton spins in the parahydrogenated precursor. Consistent with disclosed embodiments, the population difference in proton spins can be transferred to polarization on a target nuclear spin of the parahydrogenated precursor, creating a hyperpolarized parahydrogenated precursor. When the target compound is generated from the precursor by hydrogenation, the hyperpolarized parahydrogenated precursor can be the hyperpolarized target compound. When the target compound is generated from the precursor by hydrogenation and cleaving of a sidearm, the hyperpolarized parahydrogenated precursor can be cleaved to yield the hyperpolarized target compound.

Various embodiments of the present disclosure disclose a method for preparing hyperpolarized target compounds. In some embodiments, the target compound can be generated from the precursor through parahydrogenation and polarization using PHIP or SABRE, while in other embodiments the target compound can be generated from the precursor through parahydrogenation and polarization using PHIP-SAH, followed by cleavage of a sidearm.

FIG. 1 illustrates an exemplary process 100 for PHIP or PHIP-SAH polarization, consistent with disclosed embodiments. Process 100 can be used for large-scale PHIP polarization to generate target compounds for in vitro or in vivo MRI. A similar process can be used for SABRE polarization, with the hydrogenation in step 105 replaced with an exchangeable binding of the target compound and parahydrogen to a polarization catalyst. This depiction of process 100 is not intended to be limiting. Envisioned embodiments can include additional steps, or fewer steps; or steps could be combined or divided. For example, process 100 could begin with step 105, using previously generated or obtained parahydrogen. As an additional example, process 100 could terminate with purification or separation of the target compound in step 109. Likewise, the transportation in step 103 and step 111 may be optional. Furthermore, while depicted as being used in an MRI, the target compound is not necessarily limited to such a use.

Optional step 101 of process 100 depicts generation of parahydrogen, consistent with disclosed embodiments. Parahydrogen can be generated by flowing cold hydrogen gas through a chamber with a catalyst such as iron oxide, bringing the parahydrogen and orthohydrogen to their thermodynamic equilibrium. In some embodiments, at low temperatures, parahydrogen may be increasingly populated. In some alternative embodiments, liquid parahydrogen may be prepared similarly. Parahydrogen can be generated in advance, or as needed, consistent with disclosed embodiments.

Optional step 103 of process 100 depicts transport of pressurized parahydrogen containers, for example gas bottles, consistent with disclosed embodiments. These parahydrogen containers may be filled and transported to the vicinity of MRI scanners. In some alternative embodiments, the pressurized parahydrogen may be liquid parahydrogen bottles, which may also be filled and shipped. In an alternate embodiment, the parahydrogen generator is connected to a PHIP polarizer, therefore relieving the need for parahydrogen gas containers.

Step 105 of process 100 depicts parahydrogenation of a precursor, consistent with disclosed embodiments. In some embodiments, parahydrogen gas may be combined with the precursor (e.g., in a solution or mixture), hydrogenating the precursor and creating $I_{z1}I_{z2}$, the lower energy state between $|\uparrow>|\downarrow>$, $|\downarrow>|\uparrow>$ or singlet spin order on two hydrogens spins.

Step 107 depicts a transfer of a population difference in parahydrogenated proton spin states to polarization on a target nuclear spin of the parahydrogenated precursor, consistent with disclosed embodiments. Such transfer can be accomplished, consistent with disclosed embodiments, using at least one of modulation of a magnetic field applied to a solution containing the parahydrogenated precursor or application of a sequence of radiofrequency pulses. Such transfer can generate a hyperpolarized precursor. In some embodiments, the precursor to be hydrogenated and hyperpolarized may include a sidearm (e.g., the precursor can be an ester of a target compound). The hydrogenation reaction can occur in the sidearm, and spin order may be transferred to polarization on a target nuclear spin at a location in the target compound.

Step 109 depicts the purification or separation from the original solution of the hyperpolarized precursor (or a hyperpolarized target compound generated from the hyperpolarized precursor), consistent with disclosed embodiments. In some embodiments using PHIP-SAH, the purification or separation can include cleaving the hyperpolarized precursor to generate the hyperpolarized target compound. In embodiments using PHIP or SABRE, the hyperpolarized precursor can comprise the hyperpolarized target compound. The purification or separation can include inducing precipitation of the hyperpolarized precursor or hyperpolarized target compound from the original solution.

Optional step 111 depicts transport of the precipitate, consistent with disclosed embodiments. The precipitate can be transported in a transport device with a magnetic field and optionally a coolant.

Optional step 113 depicts use of the target compound, consistent with disclosed embodiments. In some embodiments, upon redissolution of the precipitated particles (and optionally after regulating temperature and pH; cleavage of the precursor and separating of the target compound; or any additional chemical reactions) the hyperpolarized target compound may be injected into a patient for use in MRI imaging (e.g., a hyperpolarized MRI experiment, or another suitable imaging action).

Target Compounds

In some embodiments, the target compound may be chosen such that following the hydrogenation and other potential chemical reactions, one of the products is a hyperpolarized target compound, such as a hyperpolarized biorelevant imaging agent, usable in HP MRI applications. In some embodiments, the hyperpolarized target compound can be produced through additional chemical reactions. Such additional chemical reactions may include adding a sidearm containing an unsaturated moiety for hydrogenation and polarization to transfer polarization to the target compound, followed by cleavage of the sidearm, e.g., by hydrolysis. For example, the ester of the target compound may be used for polarization using the PHIP-SAH method. In the PHIP-SAH method, hydrogenation by parahydrogen is conducted on a precursor, which is a chemical derivative of a target compound, such as a biorelevant imaging agent. The chemical derivative generally comprises an ester containing the biorelevant imaging agent and a sidearm containing an unsaturated carbon-carbon bond. Parahydrogen is used to hydrogenate the unsaturated carbon-carbon bond and transfer spin order from parahydrogen to the target compound. Following hydrogenation and polarization transfer, the ester may be cleaved to produce the hyperpolarized target compound. In some embodiments, various precursors and esters of the target compound may be used. In some embodiments the esters are enol or ynol esters of a carboxylic acid, in other embodiments they are esters such as allyl and propargyl esters. Various embodiments for the present disclosure disclose transferring the spin order from the $^1$H spins in the sidearm to a nuclear spin of the sidearm or the target compound itself. In some embodiments, polarization may be hyperpolarization (HP), which refers to an excess population in one or more nuclear spin states compared to a thermal equilibrium nuclear spin state distribution in a given magnetic field. Such thermal equilibrium distribution may be described by the Boltzmann distribution.

In some embodiments, spin order can be transferred first from spin order on parahydrogen to spin order or polarization on a first nuclear spin in the sidearm, and from there to a second nuclear spin in the target compound. For example, the first nuclear spin could be a $^1$H nuclear spin in the sidearm, and the second nuclear spin could be a $^{13}$C nuclear spin in the target compound, or alternatively a $^{13}$C or $^{15}$N spin in the sidearm followed by transfer to a $^{13}$C or $^{15}$N spin in the target compound. In some implementation, the $^{13}$C-$^{13}$C J couplings can be still larger than 1 Hz even for a three-bond distance, in a preferred embodiment a $^{13}$C nuclear spin further in the target compound can be hyperpolarized. For example, this enables the polarization of [2-13C]pyruvate by transfer from a $^{13}$C spin in the sidearm.

Various embodiments of the present disclosure disclose hydrogenating a sidearm of the target compound using the parahydrogen.

In some embodiments, the precursor may be chosen such that following the hydrogenation and other potential chemical reactions, one of the products is a target compound usable in HP MRI applications. In some embodiments, the target compound can be produced through additional chemical reactions following hydrogenation. Such additional chemical reactions may include adding a sidearm containing an unsaturated moiety for hydrogenation and polarization, in order to transfer polarization to the target compound, followed by cleavage of the sidearm of the target compound, e.g., by hydrolysis. For example, the ester of the target compound may be used for polarization using the PHIP-SAH method. Following hydrogenation and polarization transfer, the ester may be hydrolyzed to produce the hyperpolarized target compound.

As used herein, hydrolysis is defined as the cleavage of a molecule via a nucleophilic substitution reaction, with the addition of the elements of water. It can be also performed under anhydrous conditions under the presence of hydroxide ions.

In some embodiments, carboxylic acids having the following general formula (I) can be used as target compounds:

(I)

in which
  C* denotes the carboxylate carbon atom undergoing 13C hyperpolarization
  R is a linear, branched, or cyclic alkyl chain, which is optionally interrupted by, or substituted with, one or more group(s) selected from carbonyl (C=O), hydroxyl (C—OH), amino (NR$^1$R$^2$) halogen atom(s) and halo-alkyl group(s), or by a carbocyclic aliphatic or aromatic ring, which is, in its turn, optionally substituted by one or more functional groups In certain embodiments, a precursor of a target compound can be an unsaturated ester of the target compound. In some embodiments, an unsaturated bond in the target compound can be at least 3 bonds away from the target spin. In certain embodiments, the target spin is the C* atom molecule of formula (I). In certain embodiments following hydrogenation, the parahydrogenated protons are at least four bonds away from the target atom.

Using parahydrogenated protons are at least four bonds away from the target atom can reduce tradeoffs that might otherwise arise when using parahydrogenated protons separated from the target atom by fewer bonds. For example, using pyruvate sidearms limited to three or fewer chemical bonds between the parahydrogen protons and the target nucleus results in tradeoffs between stability, hydrogenatability, and synthesizability of the precursor. For instance, when limited to three or fewer bonds, a more stable precursor can be formulated that is more difficult to hydrogenate, or a less stable precursor can be formulated that is easier to hydrogenate. In both cases, synthesis of the precursor may be difficult. Increasing the number of bonds between the parahydrogenated protons and the target atom can reduce these tradeoffs, as the formulation of the precursor is less restricted. Thus one can formulate precursors that are easier to hydrogenate and easier to synthesize. However, transfer of polarization between the parahydrogenated protons and the target atom can become more difficult. Polarization transfer can be particularly difficult when using RF pulses and magnetic fields with amplitudes between 0 and 500 mT, as the proton resonance frequency can be difficult to distinguish at such magnetic field amplitudes (i.e. the J coupling between the protons can be larger than their Larmor frequency difference). The disclosed embodiments address that technical problem using a mediating proton that forms a quantum three-body system with the parahydrogenated protons. Spin order can be transferred from the parahydrogenated protons through the mediating proton to the target atom in the target compound. Thus acceptable levels of polarization transfer can be obtained and the benefits of having a greater separation between the parahydrogenated protons and the target compound realized.

In certain embodiments the precursor molecule structure is given by formula (II) or formula (III). Formula (II) shows the general structure of a propargylic ester, Formula (III) of a allylic ester, of the target carboxylic compound wherein the unsaturated bond is three bonds away from the target spin. After hydrogenation of the unsaturated bond with parahydrogen, the parahydrogenated protons are four and five bonds away from the target spin. In certain embodiments a mediating proton can be used to create a polarization transfer with a polarization transfer waveform to the 13C enriched position:

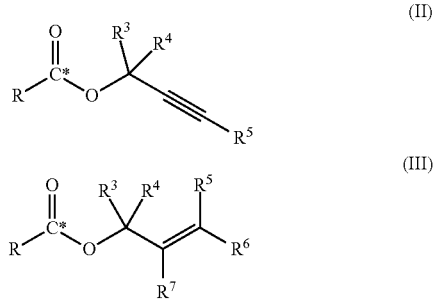

In which
C* denotes the naturally 13C enriched or, optionally, 13C labeled carboxylate carbon atom undergoing 13C hyperpolarization R is as above defined for the formula (I)

$R^3$ is either H (includes the isotopes $^1$H and $^2$H), a linear, branched or cyclic hydrocarbon chain, which is optionally interrupted by, or substituted with, one or more functional group(s), halogen atom(s) and halo-alkyl group(s), or by a carbocyclic aliphatic or aromatic ring, which is, in its turn, optionally substituted by one or more functional groups, or a heteroatom (e.g. N, O, Si, P, S, halogens, . . . ) that may also be substituted.

$R^4$ is either H (includes the isotopes $^1$H and $^2$H), a linear, branched or cyclic hydrocarbon chain, which is optionally interrupted by, or substituted with, one or more functional group(s), halogen atom(s) and halo-alkyl group(s), or by a carbocyclic aliphatic or aromatic ring, which is, in its turn, optionally substituted by one or more functional groups, or a heteroatom (e.g. N, O, Si, P, S, halogens, . . . ) that may also be substituted.

$R^5$ is either H (includes the isotopes $^1$H and $^2$H), a linear, branched or cyclic hydrocarbon chain, which is optionally interrupted by, or substituted with, one or more functional group(s), halogen atom(s) and halo-alkyl group(s), or by a carbocyclic aliphatic or aromatic ring, which is, in its turn, optionally substituted by one or more functional groups, or a heteroatom (e.g. N, O, Si, P, S, halogens, . . . ) that may also be substituted.

$R^6$ is either H (includes the isotopes $^1$H and $^2$H), a linear, branched or cyclic hydrocarbon chain, which is optionally interrupted by, or substituted with, one or more functional group(s), halogen atom(s) and halo-alkyl group(s), or by a carbocyclic aliphatic or aromatic ring, which is, in its turn, optionally substituted by one or more functional groups, or a heteroatom (e.g. N, O, Si, P, S, halogens, . . . ) that may also be substituted.

$R^7$ is either H (includes the isotopes $^1$H and $^2$H), a linear, branched or cyclic hydrocarbon chain, which is optionally interrupted by, or substituted with, one or more functional group(s), halogen atom(s) and halo-alkyl group(s), or by a carbocyclic aliphatic or aromatic ring, which is, in its turn, optionally substituted by one or more functional groups, or a heteroatom (e.g. N. O, Si, P, S, halogens, . . . ) that may also be substituted.

Parahydrogenation

Consistent with disclosed embodiments, a precursor to the target compound can be parahydrogenated by combining the precursor, parahydrogen, and a hydrogenation catalyst.

The disclosed embodiments are not limited to a particular method of generating a parahydrogenated precursor. In some embodiments, the precursor can be added to a mixture containing parahydrogen. In some embodiments, parahydrogen gas can be added to a solution containing the precursor (e.g., the parahydrogen gas can be bubbled into such a solution). In hydrogenating the precursor, the parahydrogen can create $I_{z1}I_{z2}$ order, preferential population of the lower energy state between $|\uparrow\rangle > |\downarrow\rangle$, $|\downarrow\rangle > |\uparrow\rangle$ or singlet spin order on two hydrogens spins in the precursor.

The precursor can have an unsaturated bond that can be hydrogenated by the parahydrogen gas. Following combination of the precursor and the parahydrogen, more than about 50%, more than about 60%, more than about 70%, more than about 80%, more than about 90%, or almost all of precursor may be hydrogenated. Similarly, less than about 90%, less than about 80%, less than about 70%, less than about 60%, less than about 50%, or fewer of the precursor may be hydrogenated. Or the percentage of hydrogenation can fall within a range defined by any two of the preceding values.

In some embodiments, the parahydrogenated precursor can have at least a 10%, 20%, 40% population difference in the parahydrogenated proton spin states. In some embodiments, the population difference is between spin states which include the parahydrogenated protons as well as other nuclear spins, for example additional protons on the compound. In some embodiments, the parahydrogenated precursor can include a sidearm and the parahydrogenated spins can be located on the sidearm.

In some embodiments, a concentration of the hydrogenation catalyst during hydrogenation can be at most about 50 mM, 40 mM, 30 mM, 20 mM, 10 mM, 9 mM, 8 mM, 7 mM, 6 mM, 5 mM, 4 mM, 3 mM, 2 mM, 1 mM, 0.9 mM, 0.8 mM, 0.7 mM, 0.6 mM, 0.5 mM, 0.4 mM, 0.3 mM, 0.2 mM, 0.1 mM, or less; at least about 0.1 mM, 0.2 mM, 0.3 mM, 0.4 mM, 0.5 mM, 0.6 mM, 0.7 mM, 0.8 mM, 0.9 mM, 1 mM, 2 mM, 3 mM, 4 mM, 5 mM, 6 mM, 7 mM, 8 mM, 9 mM, 10 mM, 20 mM, 30 mM, 40 mM, 50 mM, or more; or within a range defined by any two of the preceding values.

The disclosed embodiments can include methods implemented by disclosed systems for generating a hyperpolarized target compound. The disclosed methods can include mixing, by a mixing mechanism, a solution including a precursor to the target compound and a hydrogenation catalyst. A mixing mechanism may be a device for introducing, holding, and facilitating a blend, mixture, or solution of two or more materials. In some embodiments, the mixing mechanism may be disposed in a chamber, and the mixing may occur inside the chamber. In some embodiments, the solution may be mixed at a location away from the chamber. The solution may be at least about 1 ml, 2 ml, 3 ml, 4 ml, 5 ml, 6 ml, 7 ml, 8 ml, 9 ml, 10 ml, 20 ml, 30 ml, 40 ml, 50 ml, 60 ml, 70 ml, 80 ml, 90 ml, 100 ml, or more in volume; or at most 100 ml, 90 ml, 80 ml, 70 ml, 60 ml, 50 ml, 40 ml, 30 ml, 20 ml, 10 ml, 9 ml, 8 ml, 7 ml, 6 ml, 5 ml, 4 ml, 3 ml, 2 ml, 1 ml or less in volume; or within a volume range defined by any two of the preceding values.

In some embodiments, the mixing mechanism may be a gas-liquid exchange mechanism. For example, the gas-liquid exchange mechanism may be a bubbler or a diffusion system. In some embodiments, the mixing mechanism may comprise membranes adapted to permit diffusion of molecular hydrogen. In some embodiments the mixing can be performed using a spray chamber, where the solution is sprayed into a chamber filled with pressurized parahydrogen.

In some embodiments, the catalyst can be any molecule, complex or particle system that catalyzes hydrogenation. In some embodiment, there may be provided a homogeneous metal catalyst such as a rhodium complex or a ruthenium complex. The rhodium complex can be used for coordination and activation of precursor molecules and parahydrogen. In some embodiments, a heterogeneous metal catalyst connected to a nanoparticle can be used.

Various embodiments of the present disclosure disclose introducing the solution to a chamber configured to hold the solution during polarization transfer. In some embodiments, the solution may be mixed in the chamber. In some embodiments, the solution may be hydrogenated in the chamber. In some embodiments, the chamber can be within a magnetic shield (e.g., a mu metal shield). The magnetic shield can reduce the effect of the Earth's magnetic field (or other extraneous magnetic fields). Accordingly, placing the solution within the chamber can include placing the solution within the magnetic shield. In some embodiments a magnetic field generator, e.g. of an electromagnet or permanent magnet, can be configured to generate a magnetic field within the chamber. RF coils can be configured to generate RF irradiation within the chamber for inducing polarization transfer.

As described herein, in some embodiments parahydrogenation can occur prior to polarization transfer (e.g., prior to the application of RF irradiation to the solution, or the like). In various embodiments, parahydrogenation can occur during polarization transfer. For example, parahydrogen can be combined with (e.g., flowed or bubbled through the solution) the solution during modulation of the amplitude of the magnetic field.

In certain embodiments, the parahydrogen gas can be combined with the solution in the hydrogenation chamber at pressure. The pressure can be at least about 10 bar, 15 bar, 20 bar, 30 bar, 50 bar, or more; the pressure can be at most about 50 bar, 30 bar, 20 bar, 15 bar, 10 bar or less; or the pressure can be within a range defined by any two of the preceding values. In such embodiments, the parahydrogen can be combined with the solution in a metallic chamber capable of withstanding the pressure. The parahydrogen can be combined with the solution for (or the dissolution of the parahydrogen can occur in less than) a time interval. The time interval can be less than about 90 seconds, 60 seconds, 30 seconds, 20 seconds, 10 seconds, 5 seconds, 3 seconds or less; the time interval can be more than about 3 seconds, 5 seconds, 10 seconds, 20 seconds, 30 seconds, 60 seconds, 90 seconds, or more; or the time interval can be within a range defined by any two of the preceding values.

The envisioned systems and methods can be used with any suitable polarization transfer scheme that uses parahydrogen to induce polarization (e.g., PHIP, PHIP-SAH, SABRE, or any other suitable polarization transfer method).

When used with SABRE, the parahydrogen molecule and the target compound can both be bound to a polarization transfer catalyst. Polarization transfer can then occur, at least in part, while parahydrogen and the target compound are bound. In some embodiments, parahydrogen gas is dissolved in a first solution including the target compound and the polarization transfer catalyst. The first solution can be any solvent which enables SABRE polarization, including aqueous solutions or organic solvents, e.g. deuterated chloroform, deuterated acetone, deuterated ethanol or deuterated methanol.

In such embodiments, the polarization transfer catalyst can reversibly bind the target compound (e.g. pyridine or another suitable target compound) and parahydrogen, enabling spin order or polarization transfer to the target compound. Following such transfer, the average polarization of the compounds is at least about 1%, 10%, 30%, 50%; at most about 90%, 50%, 30%, 10%, or 1%; or within a range defined by any two of the preceding values. The polarized nuclear species can be $^{15}N$, $^{13}C$, $^{1}H$, $^{31}P$, $^{19}F$ or other nuclear species that can be polarized by SABRE.

In some embodiments, the polarization transfer catalyst can be or include a metallic complex, for example an iridium organometallic complex (e.g., the iridium organometallic complex [IrCl(COD)(1,3-bis(2,4,6-trimethylphenyl)imidazol-2-ylidene)]). In some embodiments, the polarization transfer catalyst can be or include a heterogeneous metal catalyst connected to a nanoparticle.

Polarization Transfer

In certain embodiments, the concentration of the precursor (in embodiments using PHIP-SAH) or target compound (in embodiments using PHIP or SABRE) in the solution prior to polarization transfer can be more than about 10 mM, 20 mM, 30 mM, 40 mM, 50 mM, 60 mM, 70 mM, 80 mM, 90 mM, 100 mM, 250 mM, 400 mM, 600 mM, 1000 mM, or more. In certain embodiments, the concentration of the precursor can be less than about 1000 mM, 600 mM, 400 mM, 250 mM, 100 mM, 90 mM, 80 mM, 70 mM, 60 mM, 50 mM, 40 mM, 30 mM 20 mM, 10 mM, or less. The volume of the solution can be greater than about 1 ml, 2 ml, 3 ml, 5 ml, 10 ml, 20 ml, 30 ml, 50 ml, 100 ml, 200 ml, 300 ml, 500 ml, 1000 ml, 2000 ml, or more; less than 2000 ml, 1000 ml, 500 ml, 300 ml, 200 ml, 100 ml, 50 ml, 30 ml, 20 ml, 10 ml, 5 ml, 3 ml, 2 ml, 1 ml, or less; or within a range defined by any two of the preceding values.

Transferring Polarization Using Radiofrequency Waveforms

Various embodiments of the present disclosure disclose applying a polarization transferring magnetic perturbation aimed to generate a magnetic field around the solution. In some embodiments, the magnetic field has a strength of at least about 0 G, 0.01 G, 0.02 G, 0.03 G, 0.04 G, 0.05 G, 0.06 G, 0.07 G, 0.08 G, 0.09 G, 0.1 G, 0.2 G, 0.3 G, 0.4 G, 0.5 G, 0.6 G, 0.7 G, 0.8 G, 0.9 G, 1 G, 2 G, 3 G, 4 G, 5 G, 6 G, 7 G, 8 G, 9 G, 10 G, 20 G, 30 G, 40 G, 50 G, 60 G, 70 G, 80 G, 90 G, 100 G, 200 G, 300 G, 400 G, 500 G, 600 G, 700 G, 800 G, 900 G, 1,000 G, 2,000 G, 3,000 G, or more; or at most about 3,000 G, 2,000 G, 1,000 G, 900 G, 800 G, 700 G, 600 G, 500 G, 400 G, 300 G, 200 G, 100 G, 90 G, 80 G, 70 G, 60 G, 50 G, 40 G, 30 G, 20 G, 10 G, 9 G, 8 G, 7 G, 6 G, 5 G, 4 G, 3 G, 2 G, 1 G, 0.9 G, 0.8 G, 0.7 G, 0.6 G, 0.5 G, 0.4 G, 0.3 G, 0.2 G, 0.1 G, or less. In some embodiments, the magnetic field has a strength that is within a range defined by any two of the preceding values. For example, in some embodiments, the magnetic field has a strength of 0.1 G-3,000 G around the solution. In some embodiments the magnetic field has a strength between 0 G-0.1 G. The magnetic perturbation can be produced by a magnetic shield, electric coils, electro-magnet or a permanent magnet or combinations of the above. The magnetic field can be applied to the sample in pulses or in a continuous wave (CW). The magnetic perturbation can be static or time varying.

A signal generator can be configured to generate one or more radiofrequency (RF) waveforms that can be applied to the sample to transfer polarization. The signal generator can include one more computing unit, processors, controllers, associate memories, PCs, computers services, or any devices capable of carrying computational operations using inputs and producing outputs. In some embodiments, RF coils may radiate, or 'apply' the RF irradiation or pulse sequences, including the first RF waveform. In some embodiments, the RF coils may have one or more channels. Channels may be pathways for RF signals. There may be provided at least one channel for each different type of NMR spectroscopy. In some embodiments, there may be at least one channel for $^1$H and at least one channel for $^{13}$C. A first RF waveform can be applied to a $^1$H channel of the one or more radiofrequency coils (RF coils) disposed around the sample. In some embodiments, a second RF waveform can be applied to a $^{13}$C channel of the RF coils. In some embodiments, the RF waveform on the $^{13}$C channel can be configured to apply a polarization transfer sequence, such as gS2hm, S2hM, SLIC, ADAPT or PulsePol.

In some embodiments, the pulse sequence may be configured to transfer the spin order from equivalent $^1$H hydrogen spins, e.g., when the chemical shift difference is smaller than the J coupling between them. An example of such a sequence may be Goldman's sequence (M. Goldman. H. Jóhannesson, C. R. Phys. 2005, 6, 575-581, which reference is herein incorporated by reference in its entirety for all purposes), the singlet to heteronuclear magnetization (S2hM) sequence, the pulsed polarization (PulsePol) sequence or other sequences used in singlet NMR (e.g. ADAPT, SLIC, etc.). Equivalent $^1$H hydrogen spins (e.g., when the chemical shift difference is smaller than the J-coupling between them) may occur for hydrogenated protons in symmetric molecules independent of the magnetic field, or in many molecular esters, in a variety of magnetic fields. For instance, equivalent $^1$H hydrogen spins may be present in magnetic fields of at least 0.01 mT, 0.1 mT, 0.2 mT, 0.3 mT, 0.4 mT, 0.5 mT, 0.6 mT, 0.7 mT, 0.8 mT, 0.9 mT, 1 mT, 2 mT, 3 mT, 4 mT, 5 mT, 6 mT, 7 mT, 8 mT, 9 mT, 10 mT, 20 mT, 30 mT, 40 mT, 50 mT, 60 mT, 70 mT, 80 mT, 90 mT, 100 mT, or more; at most 100 mT, 90 mT, 80 mT, 70 mT, 60 mT, 50 mT, 40 mT, 30 mT, 20 mT, 10 mT, 9 mT, 8 mT, 7 mT, 6 mT, 5 mT, 4 mT, 3 mT, 2 mT, 1 mT, 0.9 mT, 0.8 mT, 0.7 mT, 0.6 mT, 0.5 mT, 0.4 mT, 0.3 mT, 0.2 mT, 0.1 mT, or less; or within a range defined by any two of the preceding values.

In some embodiments the RF amplitude is between 1 Hz and 100 KHz for 13C spin precession in the rotating frame. In some embodiments the RF frequency is between 20 Hz to 200 kHz, or from 1 Hz to 1 MHz.

In some embodiments the magnetic field has a strength between 0 G-0.1 G. In certain embodiments, in this magnetic field range, the applied RF field amplitude is larger than the static magnetic field amplitude. The Hamiltonian can be expressed in a frame of reference rotating with the RF field frequency. The resulting Hamiltonian can have the form $$H = \sum_{i \in {}^1H} \gamma_H B_1 I_{ix} + \sum_{j \notin {}^1H} \gamma_X B_1 I_{jx} + \sum_{<i,j>} J_{ij}\vec{I_i}\vec{I_j} + \sum_{(i,j)} J_{ij}\vec{I_i}\vec{I_j},$$

where $B_1$ is the amplitude of the RF field, $\gamma_H$, $\gamma_X$ are the gyromagnetic ratios of the proton spins and the target spin (for simplicity, the equation assumes no other non-proton spins, but the Hamiltonian can be easily modified to include other spins as well), <ij> and (ij) the summations over the homonuclear pairs and heteronuclear pairs respectively. The constant magnetic field can be assumed to be negligible in the rotating frame. The resulting Hamiltonian in the rotating frame of reference resembles the standard Hamiltonian in a constant magnetic field in the laboratory frame without a driving field. Therefore, one can use the many polarization transfer schemes developed for these systems, e.g. magnetic field modulation, pulse sequences such as S2hM, PulsePol, CW irradiation such as SLIC and amplitude modulation and so forth, only in the rotating frame instead of in the laboratory frame. For adding an additional driving field in the rotating frame, the frequency of the first driving field would have to be taken into account, for example, applying cos $\omega_1$t cos $\omega_2$tI$_y$, would result in a oscillating field in the rotating frame with a frequency of $\omega_2$.

In some embodiments, a magnetic shield can be configured to maintain the homogeneity of the magnetic field or to generate a magnetic field below the earth's magnetic field (which is between approximately 0.25 G and 0.65 G, depending on location). The magnetic shield can maintain the magnetic field strength within the polarization chamber during application of the polarization waveform to the one or more radiofrequency coils.

Consistent with disclosed embodiments, when performing PHIP or PHIP-SAH polarization, the RF waveform can be applied to a solution containing a parahydrogenated precursor or parahydrogenated target compound. When performing SABRE polarization, the RF waveform can be applied to a solution containing the target compound, parahydrogen, and a polarization transfer catalyst. The concentrations of the target compound, parahydrogen, and a polarization transfer catalyst can be as given herein.

The polarization waveform can generate the RF field over a volume of, or including, the polarization transfer chamber 402. This volume can be greater than about 1 ml, 2 ml, 3 ml, 5 ml, 10 ml, 20 ml, 30 ml, 50 ml, 100 ml, 200 ml, 300 ml, 500 ml, 1000 ml, 2000 ml, or more; or less than 2000 ml, 1000 ml, 500 ml, 300 ml, 200 ml, 100 ml, 50 ml, 30 ml, 20 ml, 10 ml, 5 ml, 3 ml, 2 ml, 1 ml, or less; or within a range defined by any two of the preceding values. The RF field modulation can be performed over a duration. The duration can be greater than about 100 ms, 200 ms, 300 ms, 500 ms, 1000 ms, 2000 ms, 3000 ms, 5000 ms, 10000 ms, 20000 ms, 30000 ms, or more; or less than about 30000 ms, 20000 ms, 10000 ms, 5000 ms, 3000 ms, 2000 ms, 1000 ms, 500 ms, 300 ms, 200 ms, 100 ms, or less; or within a range defined by any two of the preceding values. In certain embodiments the RF amplitude is swept through the resonance condition adiabatically with the frequency being either on resonance or off resonant of the target spin Larmor frequency.

In certain embodiments, following the polarization transfer step, the non-hydrogen nuclear spin of the biorelevant imaging agent has more than about 1%, 5%, 10%, 15%, 20%, 25%, 30%, 35%, 40%, 45%, 50%, or more nuclear spin polarization; 50%, 45%, 40%, 35%, 30%, 25%, 20%, 15%, 10%, 5%, 1%, or less nuclear spin polarization; or a nuclear spin polarization that is within a range defined by any two of the preceding values. In some embodiments this polarization is achieved for a volume larger than about 5 ml, 10 ml, 20 ml, 30 ml, 40 ml, 50 ml, 60 ml, 70 ml, 80 ml, 90 ml, 100 ml, 200 ml, 300 ml, 400 ml, 500 ml, 600 ml, 700 ml, 800 ml, 900 ml, 1000 ml, or more; or 1000 ml, 900 ml, 800 ml, 700 ml, 600 ml, 500 ml, 400 ml, 300 ml, 200 ml, 100 ml, 90 ml, 80 ml, 70 ml, 60 ml, 50 ml, 40 ml, 30 ml, 20 ml, 10 ml, 5 ml, or less; or within a range defined by any two of the preceding values.

In certain embodiments certain $^1$H spins on the precursor molecule are deuterated (i.e. $^1$H spins are replaced by $^2$H spins). In the low field regime where the polarization transfer described herein occurs, the presence of the $^2$H spins only couples to the para-hydrogenated $^1$H spins or mediating $^1$H spins by a ZZ interaction due to the difference in Larmor frequencies, and therefore does not significantly affect the polarization transfer.

In certain embodiments, the precursor molecule is an ester of the target compound, polarized via the PHIP-SAH approach. In many cases, having the unsaturated bond at least four bonds away from the target nuclei enables more robust and stable precursor molecules. In certain embodiments, the two parahydrogenated protons on the side arm are both at least four bonds away from the target nuclei. In certain embodiments the polarization transfer from the parahydrogenated protons to the target nuclear spin is done using RF irradiation in the equivalence regime. In certain embodiments the direct coupling between the parahydrogenated protons and the target nuclear spin is smaller than 0.5 Hz, 0.3 Hz, 0.1 Hz, or 0.05 Hz, and a mediating proton spin is used for producing a larger effective coupling.

Compared to the high field regime (i.e. the regime where the chemical shift is larger than the J coupling between the parahydrogenated protons), where the chemical shift of the protons allows to distinguish between the different protons spectrally, in the equivalence regime using mediating proton spins is challenging due to several issues: (1) the protons cannot be individually addressed, (2) in the equivalence regime due to the indistinguishability of the proton spins, the initial singlet state is distributed among the coupled proton spins and is not localized to the parahydrogenated spins, unlike the high field regime, (3) the coupling between the mediating spin and the parahydrogenated spins is the full secular coupling, compared to the zz coupling in the high field regime. This makes sequences where one first transfers the polarization to the mediating spin less practical.

In some embodiments, mediating proton spins in the equivalence regime are used to transferring polarization to the target (e.g., $^{13}$C, $^{15}$N, etc.) nuclear spin.

In certain embodiments, some $^1$H nuclear spins on the parahydrogenated precursor molecule or the target compound are deuterated (i.e., some $^1$H nuclear spins are replaced by $^2$H nuclear spins). In the low field regime where the polarization transfer described herein occurs, the presence of the $^2$H spins only couples to the para-hydrogenated $^1$H spins or mediating $^1$H spins by a ZZ interaction due to the difference in Larmor frequencies, and therefore does not significantly affect the polarization transfer.

Transfer of Polarization Using Mediating Spins in the Equivalence Regime

In some embodiments, polarization can be transferred from $^1$H parahydrogenated spins to a spin of a target atom using an RF pulse sequence, CW irradiation or modulations of magnetic field amplitude or frequency. Mediating nuclear spins can be used to effect polarization transfer when J coupling between the spin of the parahydrogenated protons (e.g., located on a sidearm of a parahydrogenated precursor) and the spin of the target atom (e.g., a $^{13}$C atom located in the target compound) is too weak for direct polarization transfer.

The effectiveness of polarization transfer using mediating nuclear spins can depend the ambient magnetic field strength in which the polarization transfer occurs. Chemical shift differences between spins can increase with increasing field strength. Accordingly, in a low-magnetic-field-strength "equivalence regime", the J coupling and chemical shift differences between spins can be of comparable magnitude. In such an equivalence regime, protons may not be individually addressable. Furthermore, an initial singlet state may be distributed among the coupled proton spins, rather than localized to the parahydrogenated spins (e.g., due to the indistinguishability of the proton spins). Additionally, the coupling between the mediating spin and the parahydrogenated spins may be the full secular coupling (e.g., as compared to only zz coupling in higher magnetic field regimes). Such characteristics can render impractical polarization transfer using mediating nuclear spins.

An upper bound of the equivalence regime can depend on the compound in which polarization transfer occurs. For example, the upper bound can be from 0 mT to 500 mT when polarization transfer involves a parahydrogenation sidearm of an ester (e.g., such as the esters described herein, or the like). The upper bound can be even higher (e.g., >500 mT) for symmetric molecules, such as fumarate and succinate, where there exist minimal chemical shift differences between the hydrogenated proton spins. A substantial magnetic field may therefore be required to avoid operating in the equivalence regime.

The disclosed embodiments include methods of effecting polarization transfer using mediating nuclear spins in the equivalence regime. Such methods can use RF pulse sequences (e.g. PulsePol, S2hM, and the like) or CW irradiations (e.g., SLIC or a resonant frequency irradiation of a target $^{13}$C spin combined with an amplitude sweep) to achieve polarization transfer to a target (for example $^{13}$C, $^{15}$N, $^{19}$F, or $^{31}$P) nuclear spin. As such methods operate in the equivalence regime, they do not require the substantial magnetic fields required by methods that do not operate in the equivalence regime. Accordingly, such methods may be more easily implemented in clinical practice and at clinical scale.

In some embodiments, an RF sweep (e.g., a magnetic resonance pulse sequence) can be applied to a compound (e.g., a solution containing a parahydrogenated precursor to a target compound). The RF sweep can be configured to transfer population from the first and second protons to the target atom, thereby imparting a non-equilibrium nuclear spin polarization of at least 1%, 2%, 5%, 10%, or 20% to the target atom.

Figure 6A:
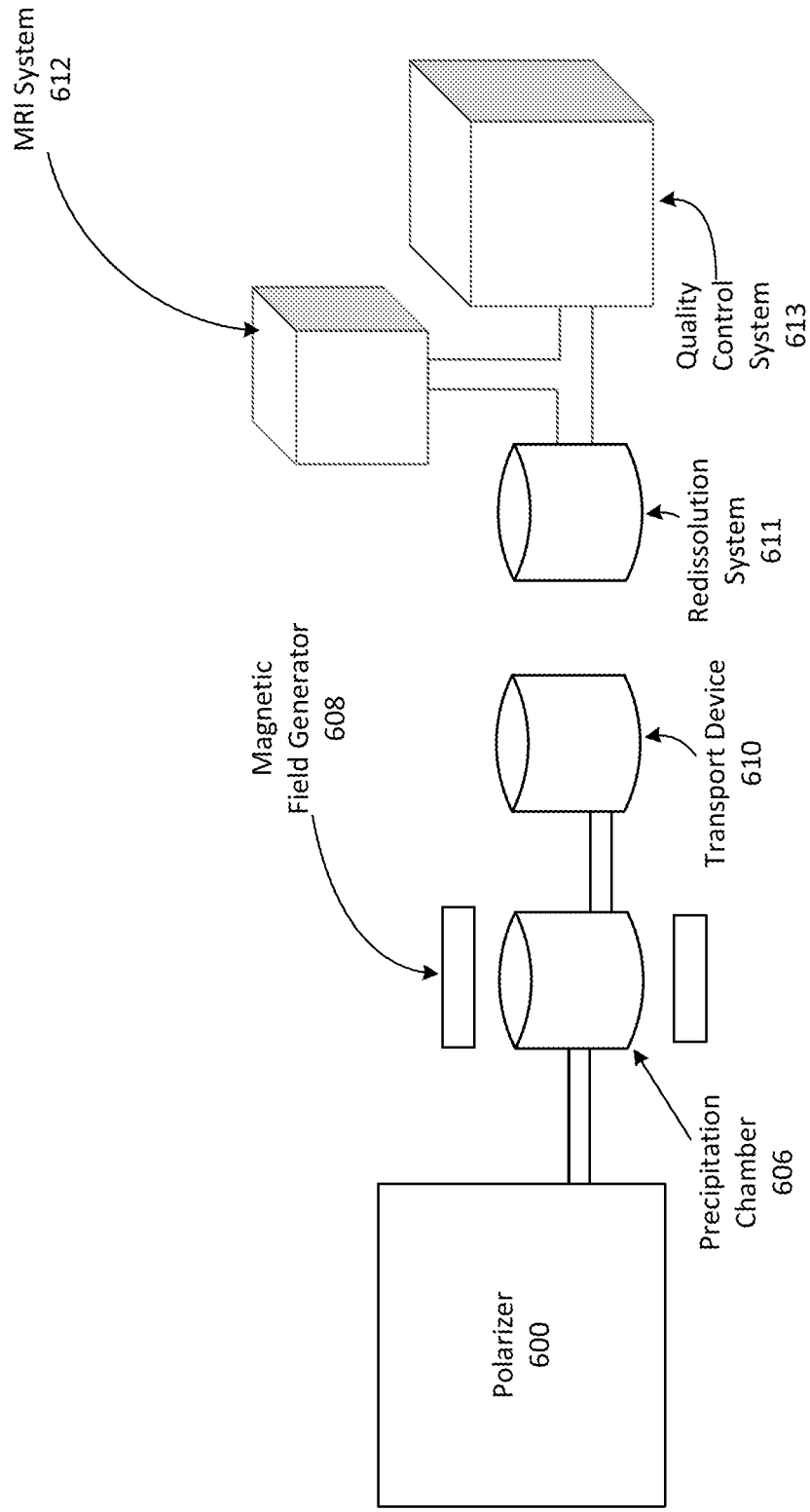
FIG. 6A depicts an exemplary schematic of a system for production of hyperpolarized target compounds, consistent with disclosed embodiments.
Figure 6B:
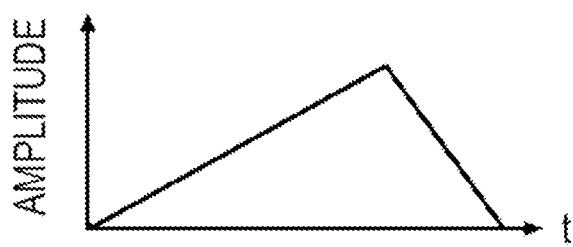
FIGS. 6B to 6D depict frequency and amplitude characteristics of radiofrequency sweeps suitable for transferring polarization using a mediating proton, consistent with disclosed embodiments.
Figure 6C:
Figure 6D:
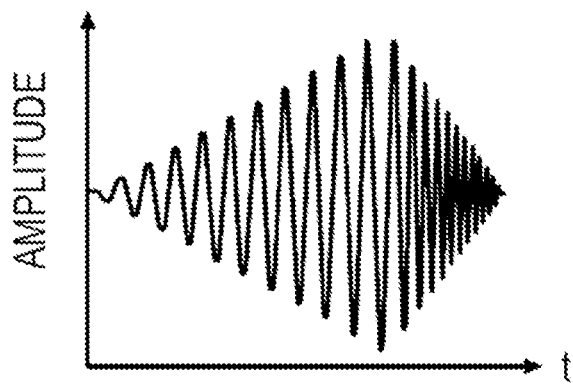

FIGS. 6B to 6D depict frequency and amplitude characteristics of radiofrequency sweeps suitable for transferring polarization using a mediating proton, consistent with disclosed embodiments. As depicted in FIGS. 6B to 6D, the RF sweep can include two phases. During a first phase, the RF amplitude can increase linearly from zero, as depicted in FIG. 6B, while the frequency is maintained at a target frequency (e.g., the $^{13}C$ Larmor frequency of the target atom), as depicted in FIG. 6C. In some embodiments, the amplitude increase can be substantially linear (e.g. the increase can include temporary pauses, increase stepwise, or follow a trajectory that departs from a linear increase at any given point by less than 5% or less than 10% of the full scale increase, or the like). In some embodiments, the amplitude increase can be substantially monotonic (e.g., the increase can follow a trajectory that includes temporary decreases, but that departs from a monotonic increase at any given point by less than 5% or less than 10% of the full scale increase, or the like). In some embodiments, the amplitude trajectory can be optimized using a numerical optimizer such as GRAPE or CRAB.

During the second phase, the RF amplitude can decrease linearly to zero, while the frequency of the RF field increases linearly. In some embodiments, the frequency increase can be substantially linear (e.g. the increase can include temporary pauses, increase stepwise, or follow a trajectory that departs from a linear increase at any given point by less than 5% or less than 10% of the full scale increase, or the like). In some embodiments, the frequency increase can be substantially monotonic (e.g., the increase can follow a trajectory that includes temporary decreases, but that departs from a monotonic increase at any given point by less than 5% or less than 10% of the full scale increase, or the like).

FIG. 6E depicts $^{13}C$ polarization in planes transverse and parallel to a static magnetic field during application of radiofrequency sweeps in accordance with FIGS. 6B to 6D, consistent with disclosed embodiments. As shown in FIG. 6E, during the first phase (e.g., first phase 681) polarization (e.g., spin order) can be transferred from the parahydrogenated protons (e.g., added across the double bond of the unsaturated precursor) through the mediating proton spin network, and to the $^{13}C$ nucleus. This process can result in a buildup of $^{13}C$ polarization that accumulates in the plane that is transverse to the static magnetic field (e.g., along the x-axis, y-axis, or elsewhere in the xy-plane), as depicted by trace 685. During the second phase (e.g., second phase 687), polarization can be adiabatically transferred from the xy-plane to the z-axis (as depicted by trace 685). In some embodiments, ensuring the $^{13}C$ polarization is parallel to the static magnetic field (e.g., along the z-axis) can facilitate transportation of the polarized precursor (or polarized target compound).

The RF sweep can be performed while a magnetic field is applied to the compound. In some embodiments, the mean magnetic field strength can be greater than at least 0.01 mT, 0.02 mT, 0.05 mT, 0.1 mT, 0.2 mT, 0.5 mT, 1 mT, 2 mT, 5 mT, 10 mT, 20 mT, 50 mT, 100 mT, 200 mT, 500 mT, 1,000 mT, 2,000 mT, 5,000 mT, or more; at most about 5,000 mT, 2,000 mT, 1,000 mT, 500 mT, 200 mT, 100 mT, 50 mT, 20 mT, 10 mT, 5 mT, 2 mT, 1 mT, 0.5 mT, 0.2 mT, 0.1 mT, 0.05 mT, 0.02 mT, 0.01 mT, or less; or a mean magnetic field strength that is within a range defined by any two of the preceding values.

In some embodiments, a first one of the parahydrogenated protons can have a first Larmor frequency determined by the mean magnetic field strength, the second one of the parahydrogenated protons can have a second Larmor frequency determined by the mean magnetic field strength, and the mediating proton can have a third Larmor frequency determined by the mean magnetic field strength. These three Larmor frequencies can differ.

In some embodiments, a first difference between the first and second Larmor frequencies, a second difference between the first and third Larmor frequencies, or a third difference between the second and third Larmor frequencies is less than twice the first J-coupling ($J_{12}$), twice the second J-coupling ($J_{23}$), or twice the third J-coupling ($J_{3c}$). In some embodiments, at least one of the first difference, second difference, or third difference is less than 20 Hz.

In some embodiments, a magnetic field sweep can be used to transfer polarization.

The magnetic field sweep can include a first, second, and third phase. In the first phase, a constant magnetic field is applied. In the second phase, the strength of the magnetic field can be dropped to a low value. In the third phase, the strength of the magnetic field can be increased. The increase can be incremental or linear.

Figure 2A:
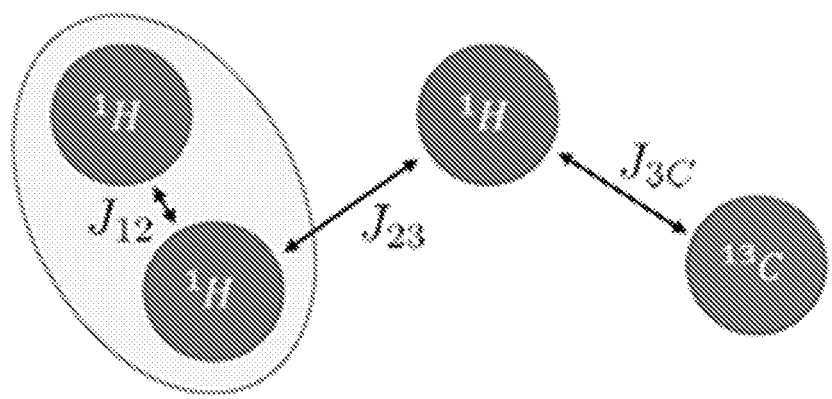
FIG. 2A depicts a quantum mechanical four-body system suitable for transferring polarization using a mediating proton, consistent with disclosed embodiments.

FIG. 2A depicts a quantum mechanical four-body system suitable for transferring polarization using a mediating proton, consistent with disclosed embodiments. This system includes two parahydrogenated spins (spins 1 and 2, with J-coupling $J_{12}$), one mediated proton spin (spin 3, with assumed negligible coupling to spin 1 and J-coupling $J_{23}$ to spin 2), and a target $^{13}C$ nuclear spin (spin C). Couplings between spins that would lead only to minor modifications in the eigenenergies (e.g., coupling of spin 3 to spin 1, coupling of spin 1 to spin C, or the like) are omitted. The general arrangement of FIG. 2A can include three $^1H$ atoms and one $^{13}C$ atom of a parahydrogenated precursor molecule. The three $^1H$ atoms can include a mediating $^1H$ atom separated by three atomic bonds from one of the two $^1H$ atoms, the two $^1H$ atoms being the result of hydrogenation of an unsaturated bond by a parahydrogen molecule.

In some embodiments, the two $^1H$ atoms are each covalently bonded to a respective $^{12}C$ atom. The respective $^{12}C$ atoms can be covalently bonded two each other. In some embodiments, the two $^1H$ atoms can be separated from the one $^{13}C$ atom by at least four chemical bonds. For example, when a cinnamyl pyruvate precursor is parahydrogenated across the double bond, the parahydrogen protons are incorporated four bonds and five bonds away from the $^{13}C$ target atom. In some embodiments, the $^{13}C$ atom (or other target atom) is covalently bonded to the mediating $^1H$ atom. In some arrangements, atoms forming the quantum mechanical three-body system can be part of pyruvate, a precursor of pyruvate containing at least one unsaturated bond, fumarate, a precursor of fumarate containing at least one unsaturated bond, succinate, or a precursor of succinate containing at least one unsaturated bond.

Figure 2B:
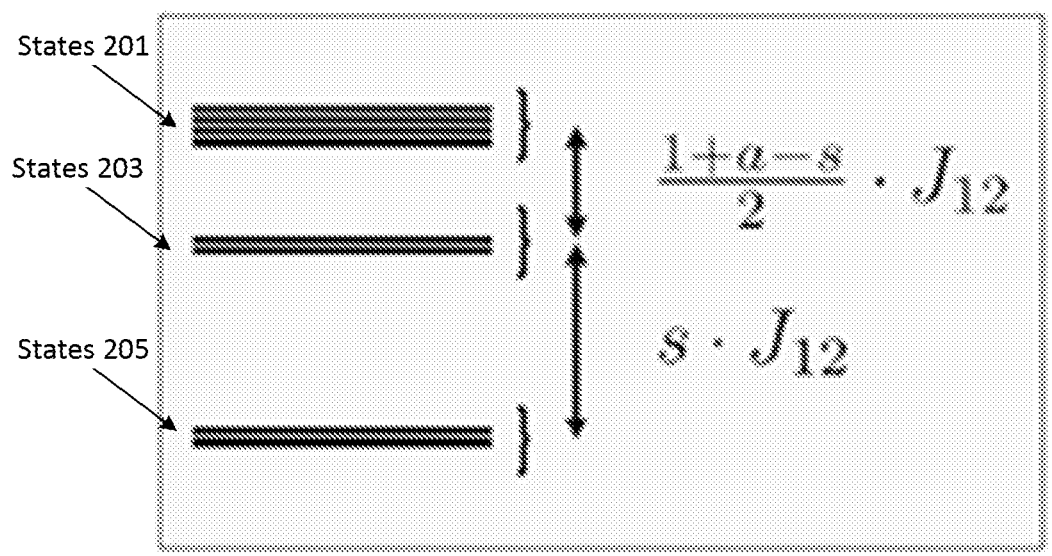
FIG. 2B discloses an approximate energy structure of the quantum mechanical three-body system of the protons depicted in FIG. 2A, consistent with disclosed embodiments.

FIG. 2B discloses an approximate energy structure of the quantum mechanical three-body system depicted by the protons in FIG. 2A, consistent with disclosed embodiments. The system of the three proton spins exhibits the eigenstates and energy splittings depicted in FIG. 2B, with $a=J_{23}/J_{12}$ and $s=\sqrt{1-a+a^2}$. The four highest-energy states (states 201) are defined as states 1-4, the two middle-energy states (states 203) as states 5 and 6, and the two lower-energy states (states 205) as states 7 and 8. The singlet state of the parahydrogenated spins is no longer an eigenstate of the system. Instead, the singlet state is distributed among states 203 and states 205. The population of states 205 is given by the relation:

$$P(7, 8) = (2 - a + 2s)/4s$$

When $J_{12} > J_{23}$, the states 7 and 8 can be highly populated (e.g., having a population greater than a value between 0.7 and 0.9 in some embodiments, or greater than an application dependent-threshold value in various embodiments). For example, taking $J_{12}=11.4$ Hz, $J_{23}=4.9$ Hz, $J_{3C}=3.15$ Hz, then P(7,8)=0.928. Therefore, the quantum mechanical three-body system includes highly-populated energy eigenstates (e.g. states 7 and 8), and lowly-populated energy eigenstates, allowing more than 90% of the population difference between the states to be transferred. A pulse sequence operable in the equivalence regime (e.g., S2hM, PulsePol, or another suitable pulse sequence), can be applied to the general arrangement depicted in FIG. 2A, using $$\frac{1+a+s}{2}J_{12}$$

as the energy gap instead of $J_{12}$ (the energy gap used when no mediating spin is present).

Figure 3:
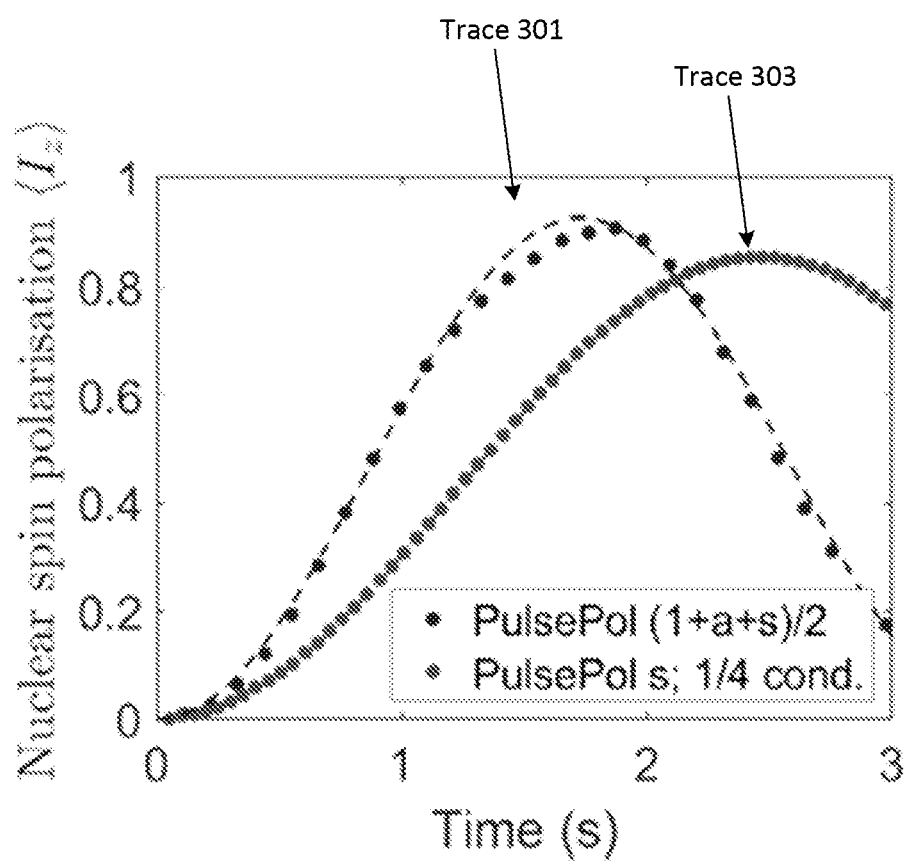
FIG. 3 depicts simulation and calculation of PulsePol transfer efficiency for the spin system in FIG. 2A, consistent with disclosed embodiments.

FIG. 3 depicts simulation and calculation of PulsePol transfer efficiency for the spin system in FIG. 2A, consistent with disclosed embodiments. The simulation and calculation of PulsePol transfer efficiency were performed using the couplings $J_{12}=11.4$ Hz, $J_{23}=4.9$ Hz, $J_{3C}=3.15$ Hz. Trace 301 depicts nuclear spin polarization with resonance condition $$E = \frac{1+a+s}{2}J_{12}, \tau = \frac{3\pi}{4E}.$$

Trace 303 depicts nuclear spin polarization with resonance condition $E=sJ_{12}$, $\tau=\pi/4E$. In both simulations, nuclear spin polarizations in excess of 80% were achieved.

Transferring Polarization Using Magnetic Field Modulation

In some embodiments, the polarization transfer magnetic perturbation can be performed in a magnetic shield (e.g. a mu shield, or the like) to achieve a homogenous, low magnetic field. The magnetic shield enables performance of polarization transfer to $^{13}C$ nuclear spins at μT magnetic fields, below the earth's magnetic field. The low magnetic field can be greater than about 0 mG, 0.1 mG, 0.2 mG, 0.3 mG, 0.4 mG, 0.5 mG, 0.6 mG, 0.7 mG, 0.8 mG, 0.9 mG, 1.0 mG, 2.0 mG, 3.0 mG, 4.0 mG, 5.0 mG, 6.0 mG, 7.0 mG, 8.0 mG, 9.0 mG, 10 mG, 20 mG, 30 mG, 40 mG, 50 mG, 60 mG, 70 mG, 80 mG, 90 mG, 100 mG, or more; or less than about 100 mG, 90 mG, 80 mG, 70 mG, 60 mG, 50 mG, 40 mG, 30 mG, 20 mG, 10 mG, 9 mG, 8 mG, 7 mG, 6 mG, 5 mG, 4 mG, 3 mG, 2 mG, 1 mG, 0.9 mG, 0.8 mG, 0.7 mG, 0.6 mG, 0.5 mG, 0.4 mG, 0.3 mG, 0.2 mG, 0.1 mG or less; or within a range defined by any two of the preceding values. At these fields, the polarization is transferred by utilizing level avoided crossings (LAC) between the proton spins and other spin species of interest, including $^{13}C$, $^{15}N$, $^{19}F$, $^{31}P$. In some embodiments, the magnetic field can be tuned to a specific magnetic field strength for the LAC. In various embodiments, to enable robust polarization transfer in larger-volume samples, the magnetic field strength can be temporally modulated. For example, the magnetic field strength can be swept through the LAC conditions. Alternatively or additionally, the sample can be physically moved inside the magnetic field. Such modulation can relax constraints on magnetic field homogeneity and on magnetic field offsets. Thus robust polarization transfer can be performed at larger volumes and with greater efficiency. Furthermore, relaxing the constraints on magnetic field homogeneity and on magnetic field offsets can permit using of less complex, precise, or expensive polarization systems.

A lower bound of the magnetic field modulation can be greater than about −10 μT, −9 μT, −8 μT, −7 μT, −6 μT, −5 μT, −4 μT, −3 μT, −2 μT, −1 μT, −0.9 μT, −0.8 μT, −0.7 μT, −0.6 μT, −0.5 μT, −0.4 μT, −0.3 μT, −0.2 μT, −0.1 μT, or more; less than about −0.1 μT, −0.2 μT, −0.3 μT, −0.4 μT, −0.5 μT, −0.6 μT, −0.7 μT, −0.8 μT, −0.9 μT, −1 μT, −2 μT, −3 μT, −4 μT, −5 μT, −6 μT, −7 μT, −8 μT, −9 μT, −10 μT, or less; or within a range defined by any two of the preceding values. A upper bound of the modulation can be greater than about 0.1 μT, 0.2 μT, 0.3 μT, 0.4 μT, 0.5 μT, 0.6 μT, 0.7 μT, 0.8 μT, 0.9 μT, 1 μT, 2 μT, 3 T, 4 μT, 5 μT, 6 μT, 7 μT, 8 μT, 9 μT, 10 μT, or more; less than about 10 μT, 9 μT, 8 μT, 7 μT, 6 μT, 5 μT, 4 μT, 3 μT, 2 μT, 1 μT, 0.9 μT, 0.8 μT, 0.7 μT, 0.6 μT, 0.5 μT, 0.4 μT, 0.3 μT, 0.2 μT, 0.1 μT, or less; or within a range defined by any two of the preceding values. The magnetic field can have such an amplitude over a volume of, or including, the polarization transfer chamber 402. This volume can be greater than about 1 ml, 2 ml, 3 ml, 5 ml, 10 ml, 20 ml, 30 ml, 50 ml, 100 ml, 200 ml, 300 ml, 500 ml, 1000 ml, 2000 ml, or more; less than 2000 ml, 1000 ml, 500 ml, 300 ml, 200 ml, 100 ml, 50 ml, 30 ml, 20 ml, 10 ml, 5 ml, 3 ml, 2 ml, 1 ml, or less; or within a range defined by any two of the preceding values. The modulation is can be performed over a duration. The duration can be greater than about 100 ms, 200 ms, 300 ms, 500 ms, 1000 ms, 2000 ms, 3000 ms, 5000 ms, 10000 ms, 20000 ms, 30000 ms, or more; less than about 30000 ms, 20000 ms, 10000 ms, 5000 ms, 3000 ms, 2000 ms, 1000 ms, 500 ms, 300 ms, 200 ms, 100 ms, or less; or within a range defined by any two of the preceding values. Accordingly, the rate of change of the amplitude of the magnetic field can be greater than about 0.05 μT, 0.1 μT, 0.5 μT, 1 μT, or more. The upper bound on the rate of change of the amplitude of the magnetic field may be determined by the capabilities of the equipment used to perform the sweep. In some embodiments, when the magnetic field is within the upper and lower bounds, disclosed above, the spatial deviation of the magnetic field over the volume during modulation can be less than about half (or a quarter, or an eighth, or a tenth) of the amplitude of the magnetic field. For example, when the magnetic field strength is less than 2 μT (or greater than −2 μT) then the spatial deviation of the magnetic field over the volume during modulation can be less than 1 μT (or less than 0.5 μT, 0.25 μT, or 0.2 uT). As an additional example, when the magnetic field strength is less than 10 μT (or greater than −10 μT) then the spatial deviation of the magnetic field over the volume during modulation can be less than 5 μT (or less than 2.5 μT, 1.25 μT, or 1.0 μT). The spatial deviation can be measured for example by taking at least 10, 30, 50, 100, 500 spatially randomly sampled or spatially equally distributed measurements of the magnetic field within the volume and calculating the standard deviation of the sampled magnetic field measurements. Such homogeneity can be achieved for example in a large homogeneous magnetic shield by having a large piercing solenoid through the magnetic shield or by using large Helmholtz coils with a large homogeneous region for producing the magnetic field amplitude modulation. In certain embodiments the modulation is a sweep of the magnetic field. In some embodiments, the magnetic field amplitude modulation includes a diabatic jump, monotonous amplitude variation or combinations thereof.

In certain embodiments, following the polarization transfer step, the non-hydrogen nuclear spin of the biorelevant imaging agent has nuclear spin polarization more than 1%, 5%, 10%, 15%, 20%, 25%, 30%, 35%, 40%, 45%, 50%, or more; less than 50%, 45%, 40%, 35%, 30%, 25%, 20%, 15%, 10%, 5%, 1% or less; or within a range defined by any two of the preceding values. In some embodiments this polarization is achieved for a solution volume larger than about 1 ml, 2 ml, 3 ml, 4 ml, 5 ml, 6 ml, 7 ml, 8 ml, 9 ml, 10 ml, 20 ml, 30 ml, 40 ml, 50 ml, 60 ml, 70 ml, 80 ml, 90 ml, 100 ml, 200 ml, 300 ml, 400 ml, 500 ml, or more; or less than about 500 ml, 400 ml, 300 ml, 200 ml, 100 ml, 90 ml, 80 ml, 70 ml, 60 ml, 50 ml, 40 ml, 30 ml, 20 ml, 10 ml, 9 ml, 8 ml, 7 ml, 6 ml, 5 ml, 4 ml, 3 ml, 2 ml, 1 ml, or less; or within a range defined by any two of the preceding values. In various embodiments, following polarization transfer a portion of the population difference in parahydrogenated proton spin states has been transferred to polarization of the target (e.g., $^{13}C$) nuclear spin of the biorelevant imaging agent. This portion can be more than 1%, 5%, 10%, 15%, 20%, 25%, 30%, 35%, 40%, 45%, 50%, or more; less than 50%, 45%, 40%, 35%, 30%, 25%, 20%, 15%, 10%, 5%, 1% or less; or within a range defined by any two of the preceding values.

In certain embodiments, the magnetic field modulation includes a diabatic jump of the magnetic field, where a jump is defined as a change of the magnetic field faster than 1 µT, 5 µT, 10 µT per second. The diabatic jump can be performed to a magnetic field where a level avoided crossing including the proton spins and a non-proton spin occur. Given the J couplings between the nuclear spins in the system, this value can be calculated analytically or identified by plotting the energy levels of the Hamiltonian for different magnetic fields, and identifying the LAC. In some embodiments, the duration where the magnetic field amplitude is at the LAC condition is less than 2 seconds, 1 second, 0.5 seconds.

In certain embodiments, modulation of the amplitude of the magnetic field can include varying the magnetic field amplitude monotonically (or monotonically over each of a limited number of interval—such as one to ten increasing interval and/or one to ten decreasing intervals). In various embodiments, the modulation of the amplitude of the magnetic field comprises linearly varying the amplitude of the magnetic field. The initial magnetic field amplitude of the sweep, the end magnetic field amplitude and the total duration of the sweep can be optimized for the target compound. In some embodiments the magnetic field amplitude during the sweep is within a lower bound and an upper bound. The lower bound can be greater than about −2 µT, −1 µT, −0.9 µT, −0.8 µT, −0.7 µT, −0.6 µT, −0.5 µT, −0.4 µT, −0.3 µT, −0.2 µT, −0.1 µT, or more; less than about −0.1 µT, −0.2 µT, −0.3 µT, −0.4 µT, −0.5 µT, −0.6 µT, −0.7 µT, −0.8 µT, −0.9 µT, −1 µT, −2 µT, or less; or within a range defined by any two of the preceding values. The upper bound can be greater than about 0.1 µT, 0.2 µT, 0.3 µT, 0.4 µT, 0.5 µT, 0.6 µT, 0.7 µT, 0.8 µT, 0.9 µT, 1 µT, 2 µT, or more; less than about 2 µT, 1 µT, 0.9 µT, 0.8 µT, 0.7 µT, 0.6 µT, 0.5 µT, 0.4 µT, 0.3 µT, 0.2 µT, 0.1 µT, or less; or within a range defined by any two of the preceding values. In some embodiments the duration of modulation can be greater than about 100 ms, 200 ms, 300 ms, 500 ms, 1000 ms, 2000 ms, 3000 ms, 5000 ms, 10000 ms, or more; less than about 10000 ms, 5000 ms, 3000 ms, 2000 ms, 1000 ms, 500 ms, 300 ms, 200 ms, 100 ms, or less; or within a range defined by any two of the preceding values. In some embodiments, the rate of amplitude change is varied along the amplitude profile. In some embodiments, a constant-adiabaticity sweep is calculated by choosing a certain subset of level avoided crossings of the spin system. In certain embodiments, the magnetic amplitude modulation includes a combination of diabatic jumps, monotonous amplitude modulation and rate of change sign reversals.

In some embodiments, certain magnetic field amplitudes can support spontaneous spin order transfer between parahydrogen and the target compound, when both are bound to a polarization catalyst. For example, SABRE-SHEATH can support such spin order transfer for 15N or 13C polarization using magnetic fields greater than about 100 nT, 200 nT, 300 nT, 400 nT, 500 nT, 600 nT, 700 nT, 800 nT, 900 nT, 1 nT, or more; less than about 1 mT, 900 nT, 800 nT, 700 nT, 600 nT, 500 nT, 400 nT, 300 nT, 200 nT, 100 nT, or less; or within a range defined by any two of the preceding values. As an additional example, SABRE-SHEATH can support such spin order transfer for $^1H$ polarization using magnetic fields above 0.1 mT and below 100 mT. The spin order of the parahydrogen may be transferred to polarization on the target compound, or to spin order on the target compound. In some embodiments using SABRE, the magnetic field value is changed between two or more fixed values to create an average dynamics leading to polarization transfer.

In alternative embodiments, the polarization transfer occurs at a magnetic field higher than 0.1 G and below 200,000 G by applying a transferring waveform utilizing RF continuous wave or pulses to transfer the spin order from the bound parahydrogen to polarization on a nuclear spin in the catalyst-bound target compound. The SLIC-SABRE, SABRE-INEPT or ADAPT sequences can be used for example in high-field SABRE transfer.

In another embodiment, the polarization of $^1H$ nuclei on a SABRE-polarized molecule, polarized either directly or by polarization transfer from another nuclei on the same molecule, is transferred to target compounds by chemical exchange, for example using the SABRE-RELAY method.

Purification and Separation

In some embodiments, the precursor may be chosen such that following the hydrogenation and other potential chemical reactions, one of the products is a biorelevant imaging agent usable in HP MRI applications. In some embodiments, the biorelevant imaging agent can be produced through additional chemical reactions following hydrogenation. Such additional chemical reactions may include cleaving of a sidearm of the molecule, e.g., by hydrolysis. For example, the ester of the biorelevant imaging agent may be used for polarization using the PHIP-SAH method. Following hydrogenation and polarization transfer, the ester may be cleaved to produce the hyperpolarized biorelevant imaging agent.

The volume of solution including the target compound, following cleavage (and concentration of the target compound produced) can depend on the volume of the solution used for polarization transfer and concentration of the precursor in that solution. Exemplary ranges of solution volumes and precursor concentrations are described herein. As further specific examples, at least 1 ml of solution including at least 10 mM of the target compound can be produced. Alternatively, at least 5 ml of solution including at least 50 mM of the target compound can be produced. Alternatively, at least 10 ml of solution including at least 100 mM of the target compound can be produced.

Consistent with disclosed embodiments, following polarization transfer (and, in PHIP-SAH embodiments, cleaving of the precursor to generate the hyperpolarized target compound) the properties of the solution containing the hyperpolarized target compound can be modified to induce precipitation of the hyperpolarized target compound.

Such precipitation can enable separation of the hyperpolarized target compound (or the hyperpolarized precursor) from other substances in the solution (e.g., sidearm fragments in embodiments using PHIP-SAH, hydrogenation catalysts, hyperpolarization catalysts in embodiments using SABRE, or the like). The precipitate can form crystals, amorphous solid particles, polycrystal material, or the like. Following the precipitation, at least a fraction of the solid hyperpolarized target compounds (or the hyperpolarized precursor) can be separated from the solution and other substances in the solution. For example, a mixture of the precipitate and solution can be filtered to remove the particles. The filtered precipitate can be washed using a second solvent. The second solvent can be selected to remove residue of the original solvent and the other substances in the solution without fully dissolving the filtered precipitate. In some embodiments the washing step occurs in less than about 300 seconds, 200 seconds, 100 seconds, 90 seconds, 80 seconds, 70 seconds, 60 seconds, 50 seconds, 30 seconds, 20 seconds, 10 seconds; in more than about 10 seconds, 20 seconds, 30 seconds, 50 seconds, 60 seconds, 70 seconds, 80 seconds, 90 seconds, 100 seconds, 200 seconds, 300 seconds, or more; or within a range defined by any two of the preceding values. Precipitation can be performed using an aqueous solution or a solution including an organic solvent, such as acetic acid, acetone, acetonitrile, benzene, 1-butanol, 2-butanol, 2-butanone, t-butyl alcohol, carbon tetrachloride, chlorobenzene, chloroform, cyclohexane, 1,2-dichloroethane, diethylene glycol, diethyl ether, diglyme (diethylene glycol dimethyl ether), 1,2-dimethoxyethane (glyme, DME), dimethylformamide (DMF), dimethyl sulfoxide (DMSO), 1,4-dioxane, ethanol, ethyl acetate, ethylene glycol, glycerin, heptane, hexamethylphosphoramide (HMPA), hexamethylphosphoroustriamide (HMPT), hexane, methanol, methyl t-butyl ether (MTBE), methylene chloride, N-methyl-2-pyrrolidinone (NMP), nitromethane, pentane, petroleum ether (ligroine), 1-propanol, 2-propanol, pyridine, tetrahydrofuran (THF), toluene, triethyl amine, water, heavy water, o-xylene, m-xylene, p-xylene. In some embodiments, an organic solvent is used for polarization and precipitation steps. For example, parahydrogen may be more soluble in a range of organic solvents than in an aqueous solution. Thus, hydrogenation can occur more efficiently in such solvents. Accordingly, in some embodiments using PHIP or PHIP-SAH, parahydrogen-induced polarization can occurs in a solution formed with an organic solvent. In various embodiments an aqueous solution is used for hydrogenation and the polarization transfer. In some embodiments, this aqueous solution can be mixed with a miscible organic solvent before precipitation of the hyperpolarized target compound.

In some embodiments, precipitation of the target compound can be induced by changing the pH of the solvent. In organic solvents, certain biorelevant imaging agents (e.g., carboxylic acids, pyridine, and the like) can be soluble in concentrations suitable for polarization using PHIP, PHIP-SAH, or SABRE. However, salts of these biorelevant imaging agents can be very insoluble. For example, such salts may be insoluble at concentrations below about 10 mM, 1 mM, 0.1 mM, 0.01 mM, or less; above about 0.01 mM, 0.1 mM, 1 mM, 10 mM, or more; or within a range defined by any two of the preceding values. An organic solution can contain a biorelevant imaging agent in a concentration suitable for hyperpolarization using PHIP, PHIP-SAH, or SABRE. Following polarization, the pH of the organic solution can be changed to induce precipitation of the salt of the biorelevant imaging agent. In aqueous solutions, the salt of certain biorelevant imaging agents (e.g., fumarate, glutamate, and the like) is more soluble than the acidic form. Thus an aqueous solution can contain a biorelevant imaging agent in a concentration suitable for hyperpolarization using PHIP, PHIP-SAH, or SABRE. Following polarization, the pH of the aqueous solution can be lowered to induce precipitation of the acidic form of the biorelevant imaging agent.

Consistent with disclosed embodiments, the change of pH can be induced by addition of an acidic or a basic molecule to the solution, such as sodium chloride or sodium hydroxide. In some embodiments, the change of pH can be induced by mixing the solution with another solution that has a substantially different pH. In some embodiments the precipitation due to change of pH occurs in less than about 100 seconds, 90 seconds, 80 seconds, 70 seconds, 60 seconds, 50 seconds, 40 seconds, 30 seconds, 20 seconds, 10 seconds, 9 seconds, 8 seconds, 7 seconds, 6 seconds, 5 seconds, 4 seconds, 3 seconds, 2 second, 1 second, or less; or more than about 1 second, 2 seconds, 3 seconds, 4 seconds, 5 seconds, 6 seconds, 7 seconds, 8 seconds, 9 seconds, 10 second, 20 seconds, 30 seconds, 40 seconds, 50 seconds, 60 seconds, 70 seconds, 80 seconds, 90 seconds, 100 seconds, or more; or within a range defined by any two of the preceding values.

In some embodiments, precipitation of the target compound can be induced without changing the pH of the solution of inducing the hyperpolarized target compound to change between a salt and an acid form.

In some embodiments, hydrogenation and polarization transfer can occur in a first solution having a first solvent. The target compound may have a high solubility in the first solvent. Precipitation can be induced by mixing the first solution with a second solvent to form a second solution. The second solvent can be chosen such that the solubility of the target compound in the second solution is low enough to initiate precipitation.

In some embodiments, the temperature of the solution is changed, thereby lowering the solubility of the hyperpolarized molecules, and initiating precipitation. In most solvents the solubility decreases as the temperature decreases. The change in temperature to the desired temperature with the lower solubility is preferably performed within less than about 100 seconds, 50 seconds, 30 seconds, 20 seconds, 10 seconds, 5 seconds, 3 seconds, 2 second, 1 second, or less; within more than about 1 second, 2 seconds, 3 seconds, 5 seconds, 10 second, 20 seconds, 30 seconds, 50 seconds, 100 seconds, or more; or within a range defined by any two of the preceding values. For example, the maximal mole fraction of acetic acid in n-heptane is 0.935 at 14.8° C., only 0.02 at −29.2° C. and lower at even colder temperatures. The selected temperature for precipitation can be selected as a temperature above the freezing point of the solvent.

In some embodiments, the surface area of the solution can be increased to induce nucleation of the precipitate. This can be achieved for example by spraying the solution through a nozzle to create very small droplets with a high surface area. In certain embodiments, microcrystal seeds (which may be of the target compound, or another biocompatible compound) can be added to the solution to induce precipitation.

In some embodiments, the pressure of the solution is changed, thereby lowering the solubility of the hyperpolarized compounds, and initiating precipitation.

In some embodiments, the concentration of the hyperpolarized target compound is raised above its solubility limit, thereby inducing precipitation without lowering the compound solubility level in the solvent. This can be achieved for example by adding unpolarized molecules of the target compound or by evaporating a certain volume of the solvent, thereby increasing the concentration of the target compound above its solubility limit.

In some embodiments, the parameters for the PHIP, PHIP-SAH, or SABRE polarization can be optimized for a high concentration, preferably above the solubility limit for the target compound in its acid or salt form, even at the expense of achieving a lower polarization. This can be achieved for example in PHIP or PHIP-SAH by starting with a high concentration of the precursors for hydrogenation and choosing a long hydrogenation time, which can cause polarization to be lowered due to relaxation, to achieve a high target compound concentration. In SABRE this can be achieved by increasing the concentration of the target compounds, at the expense that the polarization transfer from the parahydrogen to be less efficient.

In some embodiments the precipitation can be accelerated by the addition of mechanical energy or improved mixing of the mixture for a certain duration. This can be performed for example by applying ultrasonic waves on the mixture through an ultrasound solicitor, or by mechanical or magnetic mixing of the sample. In certain embodiments, the additional mixing or introduction of mechanical energy is performed for greater than about 0.1 seconds, 1 second, 5 seconds, 10 seconds, or more; less than about 10 seconds, 5 seconds, 1 second, 0.1 seconds, or less; or within a range defined by any two of the preceding values.

In some embodiments, precipitation can be induced by a chemical reaction involving a hyperpolarized target compound. The hyperpolarized target compound can react with another compound or in response to an external stimulus such as electromagnetic radiation (e.g., UV-irradiation). The product of this reaction may have a reduced solubility in comparison to the hyperpolarized target compound, thereby inducing the precipitation. For example, the external stimulus can modify a structure of the hyperpolarized target compound, thereby reducing the solubility of the hyperpolarized target compound. Following redissolution of the precipitate, additional reactions can be performed to produce a desired final product (e.g., a biorelevant imaging agent, NMR material, or the like).

In some embodiments a hydrolysis of the precursor can induce the precipitation. In some embodiments, for example using PHIP-SAH, a solvent can be selected such that the precursor is more soluble than the target compound. The concentration of the precursor in the solution can be selected such that, following cleavage of the sidearm and generation of the target compound, the target compound precipitates out of the solution. In some such embodiments, the cleavage can be initiated by changing the pH of the solution. For example, the cleavage can be initiated by adding a base (e.g., sodium hydroxide or another suitable base). In some embodiments, the solution can be formed with an organic solvent and the cleavage can be performed under basic conditions. Following the cleavage, the less-soluble target compound undergoes rapid precipitation while preserving its polarization. The same solution can be used for hydrogenation, polarization transfer, and precipitation, or another solvent can be mixed into the solution used for hydrogenation and polarization transfer.

In some embodiments using PHIP-SAH, the precipitation of the precursor can occur before cleavage. Such embodiments may be suitable when the precursor is more stable than the target compound. Precipitation of the precursor can be induced by modifying the pH of the solution such that the solubility of the precursor is reduced, or by mixing in a solution or compound which lowers the solubility of the precursor. In such embodiments, cleavage of the precursor can be performed after re-dissolution of the precursor in a solvent. The precursor can be filtered and washed as described herein to remove other substances present in the original solution, such as hydrogenation catalysts. The precursor can then be reacted (e.g., by cleaving a sidearm) to form the target compound. The target compound can be separated from other reaction products by liquid-liquid extraction or by an additional precipitation step, consistent with the precipitation methods described herein. In some embodiments using PHIP-SAH, precipitation can occur after generation of the target compound from the precursor. Such precipitation can be performed according to the methods described herein.

In some embodiments, the conversion of spin order to polarization occurs before the compounds are made to solidify and precipitate. In other embodiments, this conversion happens after re-dissolution of the crystals with the target compounds.

In some embodiments, several steps of precipitation, washing and redissolution are performed. This could be advantageous in further purifying the target compounds, increasing the relaxation time of the precipitate, or further separating the polarization and cleavage steps. For example, the first precipitation can be used for washing out the catalyst, while the second precipitation is of a crystal form with a longer relaxation time, and which can be used for transport. In another embodiment, the first precipitation is of an ester of a target compound following hydrogenation and polarization transfer, and the second precipitation is performed after the cleavage.

Consistent with disclosed embodiments, steps of precipitation (and optionally washing) can separate the hyperpolarized target compound (or hyperpolarized precursor) from other substances in the original solution (e.g., catalysts, the original solvent(s), reaction products, or the like). For example, most of the hydrogenation catalyst present in the original solution can be retained in the original solution following precipitation of the target compound. In some embodiments, the precipitate (optionally following washing) can retain less than about 1%, 0.1%, 0.01%, 0.001%, or less of the hydrogenation catalyst; or retain more than about 0.001%, 0.01%, 0.1%, 1% or more of the hydrogenation catalyst. Similarly, in embodiments using PHIP-SAH and cleavage of the precursor molecule before precipitation, the precipitate can retain less than about 1%, 0.1%, 0.01%, 0.001%, or less of the cleavage byproducts (e.g., the sidearm or other residues of the cleavage); retain more than about 0.001%, 0.01%, 0.1%, 1% or more of the cleavage byproducts; or retain an amount of the cleavage byproducts within a range defined by any two of the preceding values.

In some embodiments, the amount of the hyperpolarized particles in the precipitate is accumulated over several iterations of hydrogenation, polarization transfer and precipitation of additional target compounds.

Hyperpolarized solid particles, especially in micrometer size, can be a valuable resource for several applications.

Some applications include using the microparticles as NMR/MRI tracers, for example when using microparticles which do not dissolve in aqueous solutions. In some embodiments, the solid hyperpolarized compound obtained using precipitation of the PHIP, PHIP-SAH, or SABRE hyperpolarized solution is dissolved in a solvent and used as a hyperpolarized agent in hyperpolarized NMR or MRI.

In some embodiments, following the precipitation and separation from the original solvent (and potentially transport of the hyperpolarized precipitate), the precipitate can be redissolved in a solvent (e.g., for use as an agent in hyperpolarized MRI). Preferably the solvent is a biocompatible solvent, preferably an aqueous solution. In some embodiments the redissolution is performed in less than about 60 seconds, 30 seconds, 20 seconds, 10 seconds, 5 seconds; more than about 5 seconds, 10 seconds, 20 seconds, 30 seconds, 60 seconds, or more; or within a range defined by any two of the preceding values.

In some embodiments, following re-dissolution, the target compound can be present in a higher concentration than the concentration used during the PHIP, PHIP-SAH, or SABRE polarization. In some embodiments the concentration of the hyperpolarized target compound after re-dissolution is greater than about 100 mM, 150 mM, 200 mM, 250 mM, 300 mM, 350 mM, 400 mM, 450 mM, 500 mM, or more, less than about 500 mM, 450 mM, 400 mM, 350 mM, 300 mM, 250 mM, 200 mM, 150 mM, 100 mM, or less; or within a range defined by any two of the preceding values. Thus, the concentration of the precursor or target compound during polarization can be independent of the concentration of the molecules in the injection solution. The concentration of the precursor or target compound during polarization can be selected for efficient polarization transfer. In some embodiments, this polarization concentration can be less than the concentration of the hyperpolarized target compound after re-dissolution. For example, the polarization concentration can be less than about 300 mM, 200 mM, 150 mM, 140 mM, 130 mM, 120 mM, 110 mM, 100 mM, 90 mM, 80 mM, 70 mM, 60 mM, 50 mM, 40 mM, 30 mM, 20 mM, 10 mM, or less; or greater than about 10 mM, 20 mM, 30 mM, 40 mM, 50 mM, 60 mM, 70 mM, 80 mM, 90 mM, 100 mM, 110 mM, 120 mM, 130 mM, 140 mM, 150 mM, 200 mM, 300 mM, or more; or within a range defined by any two of the preceding values. In some embodiments, samples of the precipitate may exhibit more than about 30%, 20%, 10%, 5%, 1% or less polarization; or less than about 1%, 5%, 10%, 20%, 30% or more polarization. Following re-dissolution of the particulate, the concentration of catalysts, the precursor, or cleavage byproducts may each be less than 1 µM, 900 nM, 800 nM, 700 nM, 600 nM, 500 nM, 400 nM, 300 nM, 200 nM, 100 nM, 90 nM, 80 nM, 70 nM, 60 nM, 50 nM, 40 nM, 30 nM, 20 nM, 10 nM, 9 nM, 8 nM, 7 nM, 6 nM, 5 nM, 4 nM, 3 nM, 2 nM, 1 nM, or less; greater than 1 nM, 2 nM, 3 nM, 4 nM, 5 nM, 6 nM, 7 nM, 8 nM, 9 nM, 10 nM, 20 nM, 30 nM, 40 nM, 50 nM, 60 nM, 70 nM, 80 nM, 90 nM, 100 nM, 200 nM, 300 nM, 400 nM, 500 nM, 600 nM, 700 nM, 800 nM, 900 nM, 1 µM, or more; or within a range defined by any two of the preceding values. In some embodiments, the purity of the hyperpolarized target compound following redissolution is greater than 90%, 92%, 95%, 98%, 99%, or more; less than 99%, 98%, 95%, 92%, 90% or less; or within a range defined by any two of the preceding values. In various embodiments, at least a fraction of the hyperpolarized compounds can be separated from the cleaved sidearms, or other reaction byproducts, if such exist.

Figure 4:
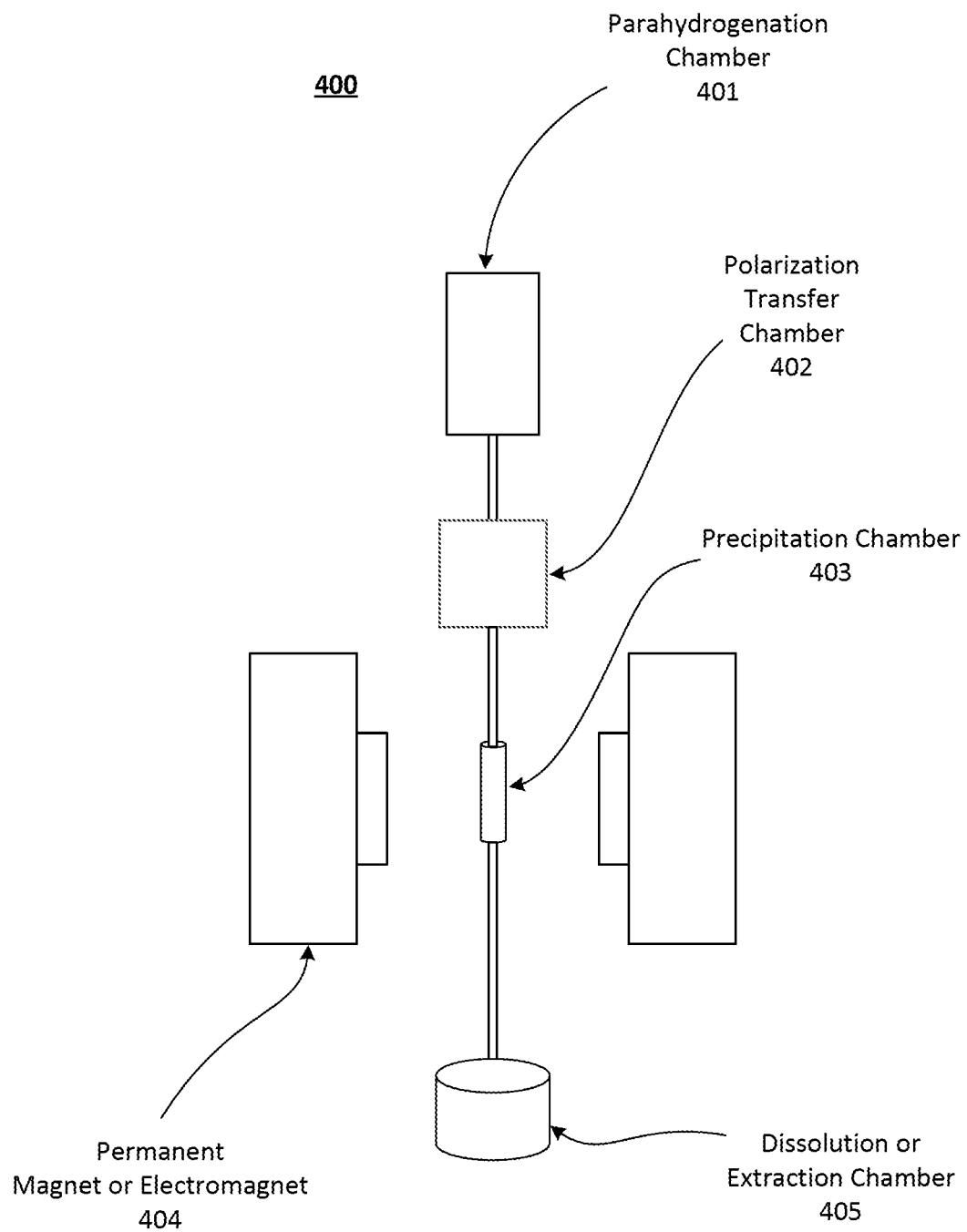
FIG. 4 depicts an exemplary schematic of a polarizer for obtaining a high-concentration, biocompatible solution including a hyperpolarized target compound.

FIG. 4 depicts an exemplary schematic of a polarizer 400 for obtaining a high-concentration, biocompatible solution with hyperpolarized target compounds. Polarizer 400 can be used with PHIP, PHIP-SAH, or SABRE polarization methods. Parahydrogen can be dissolved in the solution containing the catalysts and target compounds in parahydrogenation chamber 401. Chamber 401 can be of a variety of designs known in the art to dissolve a large amount of parahydrogen in the solution, and achieve a high efficiency of hydrogenation or polarization transfer. In some embodiments, chamber 401 can include an inlet for introducing parahydrogen to the solution with a high pressure. In various embodiments, chamber 401 can be or include a flow chamber, in which a membrane separates the solution and flowing parahydrogen gas, and enables the parahydrogen to dissolve into the solution with a high surface area. In another embodiment chamber 401 can be a parahydrogen chamber, where the solution is sprayed into the chamber in small droplets, thereby establishing a large surface area for the dissolution of parahydrogen.

The transfer of spin order on the parahydrogen molecules to polarization on the target compounds can be performed in polarization transfer chamber 402. For example, for PHIP or PHIP-SAH polarization, the polarization can be transferred by crossing a specific low magnetic field, typically lower than 1 µT, either during dissolving the hydrogen or afterwards. In another embodiment the magnetic field sweep includes at least some range between −10 µT and 10 µT, In another embodiment, a magnetic field of 0.1 G or above can be used and the polarization transfer is induced by a sequence of RF irradiation. In SABRE polarization, in a certain embodiment the polarization transfer occurs by dissolving the hydrogen in a specific magnetic field. This magnetic field can be lower than earth magnetic field, and therefore require a magnetic shield such as used in SABRE-SHEATH, or it can be higher than earth magnetic field such as used for 1H polarization via SABRE. In another embodiment, a magnetic field higher than 0.1 G is used and the polarization transfer is induced by a sequence of RF irradiation.

Precipitation chamber 403 can be used to induce precipitation of the hyperpolarized target compounds. In some embodiments, chamber 403 can include an inlet (e.g., a reagent port, or the like) for introducing a powder or solution (e.g., a precipitation agent) to mix with the solution containing the hyperpolarized target compound and induce the precipitation. In some embodiments, chamber 403 can include a stimulation port for introducing an electromagnetic radiation (e.g., ultraviolet radiation, or the like) into chamber 403. As described herein, the electromagnetic radiation can cause a solubility reducing change in the structure of the hyperpolarized target compound (e.g., thereby inducing precipitation of the hyperpolarized target compound). In some embodiments, the added powder or solution can include a base or acid, such as sodium hydroxide, potassium hydroxide, hydrogen chloride or sulfuric acid. In some embodiments the added powder or solution can induce a hydrolysis of the hyperpolarized compounds.

In some embodiments, chamber 403 can include a separation component for separating the precipitated compounds from a solution. In some embodiments, this component can be a filter which enables solvents to pass through but not microparticles. Example filters are commercially available sterile filters. In another embodiment, the separation component can include a centrifuge, which can be configured to centrifugally separate the precipitate from the solution (or separate different precipitates by particle size). In another embodiment, the precipitated crystals are given sufficient time to precipitate to the bottom of the separation component, preferably in a designed well, which enables the solution to be washed or diluted with little effect on the precipitated particles. In another embodiment, the separation component can include a heating element to heat evaporate the solution and preserve the precipitated particles. In another embodiment, the separation component can include temperature and pressure controllers to enable the sample to be separated by a freeze-drying method, including freezing the sample and sublimating the mixture excluding the precipitated particles.

In certain embodiments, the chamber 403 can include an inlet for introducing a solution for a washing step, wherein the solvent with the catalyst is washed away or significantly diluted with a washing fluid. In some embodiments the washing fluid is biocompatible. For example, if the separation component includes a filter, the washing fluid can flow through the filter, washing the precipitated particles from the original solvent.

A magnetic field generated by permanent magnet or electromagnet 404 can be applied to at least a portion of the precipitation chamber. In one embodiment, the magnetic field is applied to most or to all of the precipitation chamber. The magnetic field can be configured so that some of the precipitated particles are subject to a magnetic field of greater than about 1 mT, 10 mT, 100 mT, 1 T, 2 T, or more; or less than 2 T, 1 T, 100 mT, 10 mT, 1 mT, or less.

In some embodiments, a large volume of precipitated hyperpolarized particles can be accumulated by repeated iterations of parahydrogen dissolution, hyperpolarizing target compounds and precipitation. This can be performed in a continuous flow, in discrete batches or in a mix of continuous flow and discrete batches. In some embodiments, some of the steps are performed on several batches at once, while other steps are performed sequentially on each batch. This can be the case for example when one step can be performed on larger volumes than other steps. For example, in some embodiments, parahydrogen dissolution can be performed on a solution volume greater than about 5 ml, 20 ml, 50 ml, 100 ml or more (or less than about 100 ml, 50 ml, 20 ml, 5 ml, or less), while the polarization transfer can be performed on a smaller volume. In some embodiments the parahydrogen dissolution will be performed on a large volume of solution, while the polarization transfer will be performed sequentially on smaller batches. In this example the precipitation can be performed sequentially on each batch following polarization transfer or alternatively on larger batches following the accumulation of larger volumes of hyperpolarized target compounds following polarization transfer.

The particles are then dissolved in dissolution or extraction chamber 405, where they are re-dissolved and extracted for detection in hyperpolarized NMR or MRI. In some embodiments, the re-dissolution can be performed in a biocompatible solvent. In a preferred embodiment the solvent is an aqueous solution. In a preferred embodiment, the dissolution chamber includes an inlet for introducing the solvent. In a preferred embodiment the dissolution chamber includes an outlet. In another embodiment, the dissolved particles are injected directly from the dissolution chamber into the patient in a HP MRI scanner. In a preferred embodiment, a magnetic field generated by a permanent or electromagnet is applied to the dissolution chamber. The magnetic field in the region of the precipitated particles before dissolution can be greater than about 1 mT, 10 mT, 100 mT, 1 T, 2 T, or more; less than 2 T, 1 T, 100 mT, 10 mT, 1 mT, or less; or within a range defined by any two of the preceding values.

In some embodiments, chamber 203 and chamber 205 can be the same chamber. This chamber could be optionally transported between the precipitation and the dissolution to a different location. In some embodiments, chamber 201 and chamber 203 can be the same chamber.

Transportation

Consistent with disclosed embodiments, polarization transfer and use of the target compound can occur at different locations. In various embodiments, the precursor (in the solution used for polarization transfer or as a precipitate) can be transported to another location following precipitation. In various embodiments, the target compound (in the solution used for polarization transfer, as a precipitate, or redissolved) can be transported to another location. The disclosed embodiments are not necessarily limited to any particular transport distance or duration. Instead, a maximum distance or duration can be determined based on the target compound, the original degree or polarization, the required final degree of polarization, and the transport conditions. In some embodiments, the precipitate can be transported at least one meter in a suitable transportation device.

Consistent with disclosed embodiments, a transportation device can be configured to transport samples of the precursor or target compound. The transportation device can be arranged and configured for transporting one or more samples simultaneously. The transportation device can include a transport chamber configured to receive the one or more samples. The transportation device can be configured to maintain the transport chamber within a predetermined temperature range and a predetermined magnetic field strength. The transportation device can be configured to maintain the one or more samples in a magnetic field of more than about 10 G, 100 G, 1000 G, or more; or less than 1000 G, 100 G, 10 G, or less.

A permanent magnet or an electromagnet included in the transportation device can provide the magnetic field. Moreover, in some embodiments, the permanent magnet or electromagnet can be shielded to reduce the strength of the magnetic field outside the transportation device. The transportation device can also include a cooling system. The cooling system can be configured to maintain samples at a predetermined temperate or within a predetermined range of temperatures during transport. For example, the cooling system can be configured to maintain the samples at a temperature below 270 K, below 80 K, or below 4 K. In some embodiments, the transportation device can be configured to maintain the samples at approximately the temperature of liquid nitrogen. The transportation device can include insulation between the cooling system and the exterior of the transportation device, to minimize heat exchange with the external environment. In some embodiments, the cooling system can be configured to maintain the temperature of the samples using a cold gas flow. In various embodiments, the cooling system can be configured to maintain the temperature of the samples using a liquid coolant. In various embodiments, the transportation device can include a Dewar to provide cooling of the samples. In order to distribute the hyperpolarized samples also across large distances, the container preferably can be transported by standard transportation vehicles, such as planes, trains, trucks, cars, and ships.

In some embodiments the hyperpolarized precipitated particles are transported in the transportation device. In some embodiments the relaxation time of the hyperpolarized precipitated particles in the transportation device is longer than about 1 minute, 10 minutes, 30 minutes, 1 hour, 3 hours, 10 hours, or more; or shorter than about 10 hours, 3 hours, 1 hour, 30 minutes, 10 minutes, 1 minute, or less.

Exemplary Systems

Figure 5A:
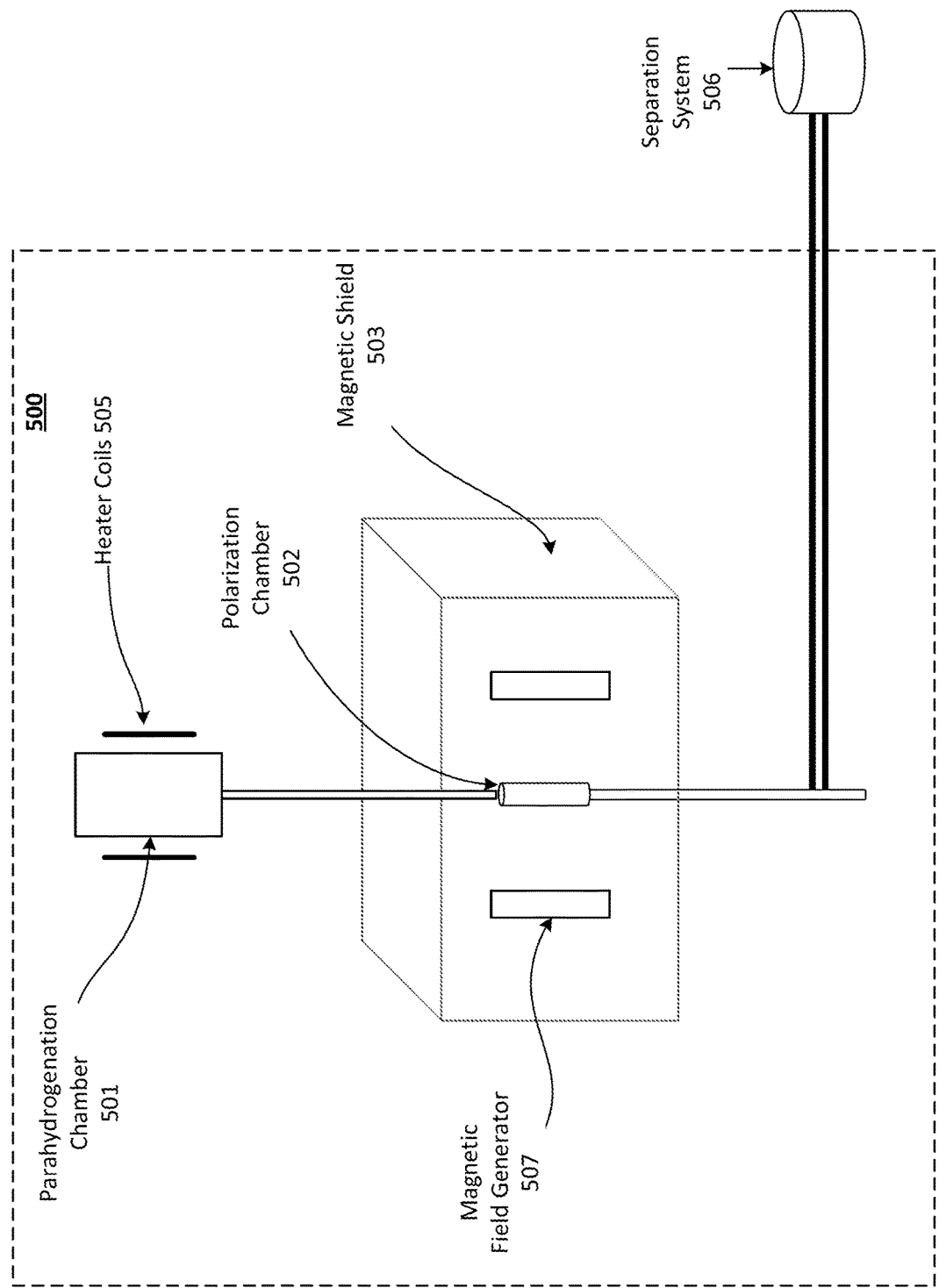
FIGS. 5A, 5B, and 5C each depicts an exemplary schematic of a system including polarizer for obtaining a high-concentration, biocompatible solution including a hyperpolarized target compound and a separation system.
Figure 5B:
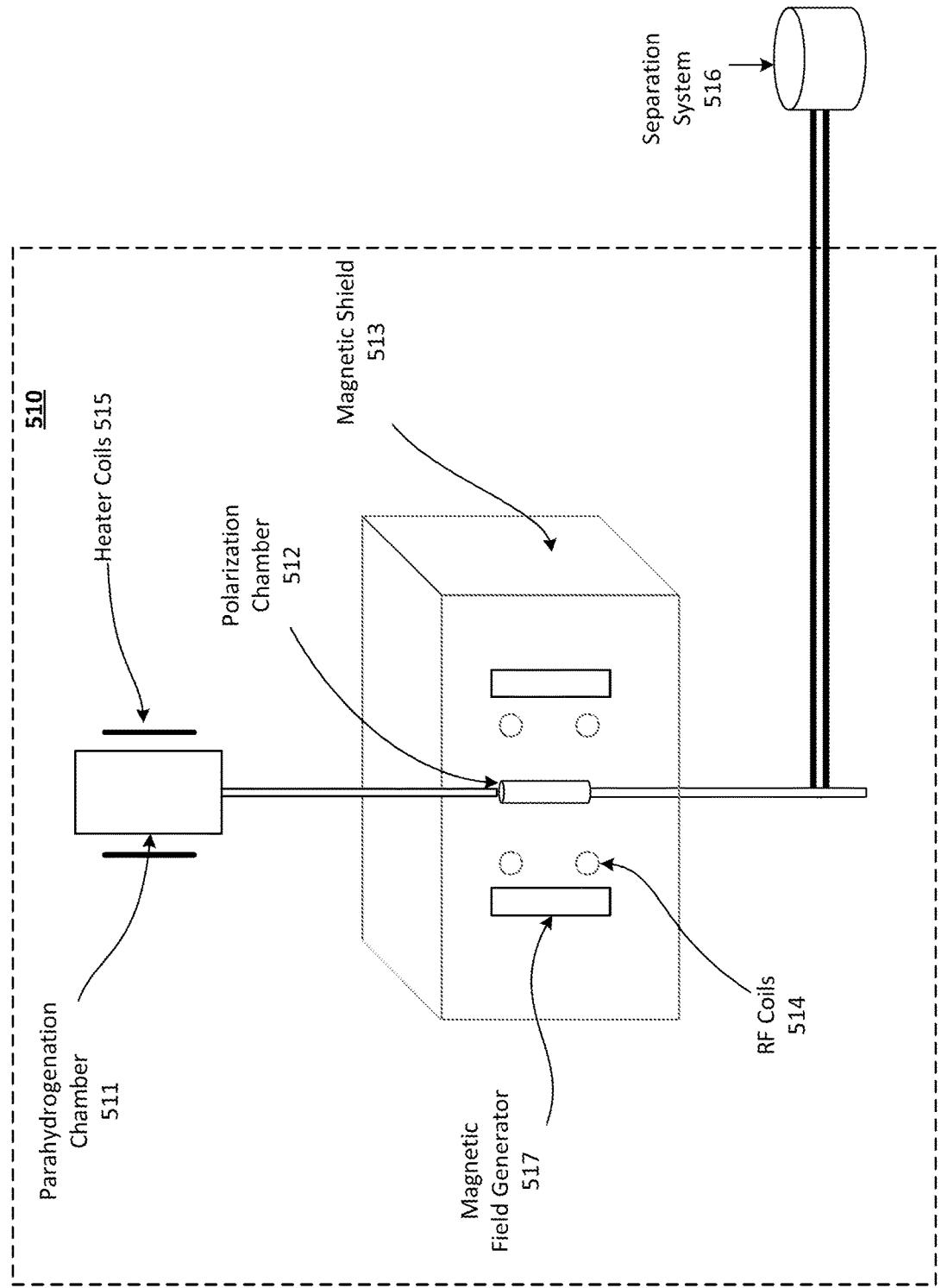
Figure 5C:
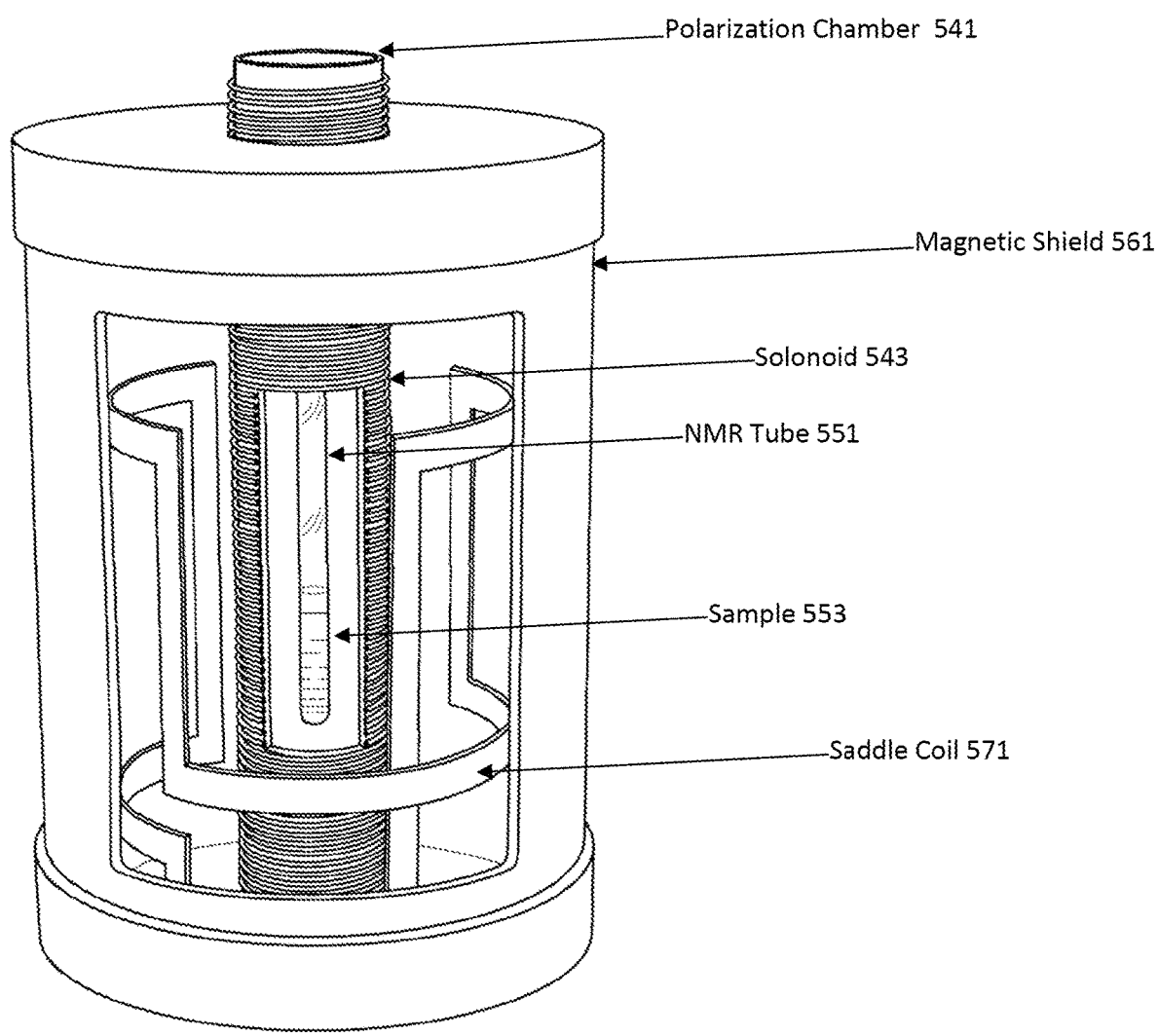

FIGS. 5A, 5B, and 5C each depicts an exemplary schematic of a system including polarizer for obtaining a high-concentration, biocompatible solution including a hyperpolarized target compound and a separation system. Such systems can be used with PHIP, PHIP-SAH, or SABRE polarization methods. FIG. 5A depicts an exemplary polarizer 500, consistent with disclosed embodiments. In PHIP or PHIP-SAH embodiments, polarizer 500 can include a hydrogenation device configured to generate a solution of a parahydrogenated precursor to a target compound (e.g., a parahydrogenated precursor solution). The hydrogenation device can generate the parahydrogenated precursor solution by mixing a solvent, parahydrogen gas, and a precursor of the target compound. In some embodiments, the hydrogenation device can mix a solution containing the precursor dissolved in the solvent (e.g., a precursor solution). In some embodiments, the precursor can include an unsaturated chemical bond. The parahydrogen gas can react with the precursor at the unsaturated chemical bond to form the parahydrogenated precursor. In some embodiments, the precursor can be a precursor of pyruvate containing at least one unsaturated bond, a precursor of fumarate containing at least one unsaturated bond, or a precursor of succinate containing at least one unsaturated bond. In SABRE embodiments, the hydrogenation device can combine a solution including the target compound and a polarization catalyst with the parahydrogen. The hydrogenation catalyst can bring the parahydrogen into proximity with the target compound to enable polarization transfer.

Consistent with disclosed embodiments, the hydrogenation device can include parahydrogenation chamber 501. Chamber 501 can be designed and configured to accommodate combination of the solvent (or precursor solution) with parahydrogen. Chamber 501 can be designed and configured to achieve a high efficiency of hydrogenation. The parahydrogen can be combined with the solvent (or precursor solution) for (or the dissolution of the parahydrogen can occur in less than) a time interval. The time interval can be less than about 90 seconds, 60 seconds, 30 seconds, 20 seconds, 10 seconds, 5 seconds, or less; more than about 5 seconds, 10 seconds, 20 seconds, 30 seconds, 60 seconds, 90 seconds, or more; or within a range defined by any two of the preceding values. In certain embodiments, more than about 30 mM, 50 mM, 100 mM, 250 mM, 400 mM, 600 mM, 1000 mM, or more; less than about 1000 mM, 600 mM, 400 mM, 250 mM, 100 mM, 50 mM, 30 mM, or less; or within a range defined by any two of the preceding values of the precursor is hydrogenated.

In some embodiments, chamber 501 can include a bubbler configured to introduce the parahydrogen gas into the solvent (or precursor solution). For example, chamber 501 can include an inlet for introducing pressurized parahydrogen to the solvent (or precursor solution). In certain embodiments, the parahydrogen is introduced to the solvent (or precursor solution) in the hydrogenation chamber at a pressure at least about 10 bar, 15 bar, 20 bar, 25 bar, 30 bar, 35 bar, 40 bar, 45 bar, 50 bar, or more; at most about 50 bar, 45 bar, 40 bar, 35 bar, 30 bar, 25 bar, 20 bar, 15 bar, 10 bar, or less; or within a range defined by any two of the preceding values. In certain such embodiments the high-pressure dissolution of the parahydrogen into the solvent (or precursor solution) occurs in a metallic chamber capable of withstanding the pressure at which the parahydrogen is introduced. In other embodiments the chamber is made out of a plastic material.

In certain embodiments the bubbler includes a nozzle head which introduces the parahydrogen to the solvent (or precursor solution) in microbubbles for larger surface areas.

In various embodiments, chamber 501 can be a flow chamber. In such embodiments, a membrane can separate the solvent (or precursor solution) and flowing parahydrogen gas.

The membrane can be arranged within the flow chamber to have a high surface area, to enable the parahydrogen to dissolve into the solvent (or precursor solution).

In various embodiments, chamber 501 can include a chamber filled with parahydrogen gas. An aerosolizer in chamber 501 can be configured to spray the solvent (or precursor solution) into the chamber in small droplets, thereby establishing a large surface area for the dissolution of parahydrogen.

In some embodiments, heating coils 505 can be disposed around or within chamber 501. Such coils can be energized to control the temperature of the solution within chamber 501.

Consistent with disclosed embodiments, the polarization device can include polarization chamber 502. Polarization chamber 502 can be configured to receive the parahydrogenated precursor solution from the hydrogenation device. Polarization chamber 502 can include a polarization region having a volume. The volume may be at least about 10 mL, 20 mL, 30 mL, 40 mL, 50 mL, 60 mL, 70 mL, 80 mL, 90 mL, 100 mL, 200 mL, 300 mL, 400 mL, 500 mL, 600 mL, 700 mL, 800 mL, 900 mL, 1000 mL, or more; 1000 mL, 900 mL, 800 mL, 700 mL, 600 mL, 500 mL, 400 mL, 300 mL, 200 mL, 100 mL, 90 mL, 80 mL, 70 mL, 60 mL, 50 mL, 40 mL, 30 mL, 20 mL, 10 mL, or less; or within a range defined by any two of the preceding values.

Polarizer 500 can include a polarization device configured to generate a solution of a polarized parahydrogenated precursor to the target compound (e.g., a polarized parahydrogenated precursor solution). Consistent with disclosed embodiments, the polarization device can include a magnetic field generator 507 capable of setting the magnetic field amplitude in the polarization chamber 502 (or the polarization region) to a specific value (or setting the magnetic field to follow a particular time-dependent amplitude trajectory).

Consistent with disclosed embodiments, magnetic field generator 507 can modulate the magnetic field across a specified range between −10 µT and 10 µT within polarization chamber 502 (or the polarization region). In some embodiments, magnetic field generator 507 can modulate the magnetic field across the specified range. In certain embodiments, when the amplitude of the magnetic field during modulation is less than 10 µT the spatial deviation of the magnetic field during modulation is less that half (or a quarter, or an eighth, or a tenth) of the amplitude of the magnetic field. In some embodiments, such homogeneity can be achieved (e.g., in a large homogeneous magnetic shield) by having a large piercing solenoid through the magnetic shield or by using large Helmholtz coils with a large homogeneous region for producing the magnetic field amplitude modulation.

The modulation can be performed over a duration. In some embodiments, the duration can be between about 100 ms and 30000 ms (e.g., as described herein). In certain embodiments the modulation can be a sweep of the magnetic field. In some embodiments, the magnetic field coils can be controlled by an external wave-form generator. The external wave-form generator can be configured to generate a varying magnetic field in the magnetic shield to efficiently transfer the polarization. In certain embodiments, for example in SABRE polarization, the magnetic field in the polarization chamber 502 can be kept at a constant value or range less than about 1 µT, 2 µT, 3 µT, 4 µT, 5 µT, 6 µT, 7 µT, 8 µT, 9 µT, 10 µT, 20 µT, 30 µT, 40 µT, 50 µT, 60 µT, 70 µT, 80 µT, 90 µT, 100 µT, 200 µT, 300 µT, 400 µT, 500 µT, 600 µT, 700 µT, 800 µT, 900 µT, 1000 µT, or greater, a constant value or range greater than about 1000 µT, 900 µT, 800 µT, 700 µT, 600 µT, 500 µT, 400 µT, 300 µT, 200 µT, 100 µT, 90 µT, 80 µT, 70 µT, 60 µT, 50 µT, 40 µT, 30 µT, 20 µT, 10 µT, 9 µT, 8 µT, 7 µT, 6 µT, 5 µT, 4 µT, 3 µT, 2 µT, 1 µT, or less; or within a range defined by any two of the preceding values. The magnetic field in the polarization chamber 302 can be kept at the constant value or range for at least about 1 second, 2 seconds, 3 seconds, 4 seconds, 5 seconds, 6 seconds, 7 seconds, 8 seconds, 9 seconds, 10 seconds, 20 second, 30 seconds, 40 seconds, 50 seconds, 60 seconds or more; at most about 60 seconds, 50 seconds, 40 seconds, 30 seconds, 20 seconds, 10 seconds, 9 seconds, 8 seconds, 7 seconds, 6 seconds, 5 seconds, 4 seconds, 3 seconds, 2 seconds, 1 second, or less; or within a range defined by any two of the preceding values.

In certain embodiments, the magnetic field modulation can be performed by flowing the solution through an area inside the magnetic shield 503 with a constant magnetic field profile.

In certain embodiment a single solenoid can be used for controlling the magnetic field gradient in the entrance and exit to the magnetic shield 503, as well for modulating the magnetic field inside the shield.

Consistent with disclosed embodiments, the polarization device can include magnetic shield 503. In some embodiments, magnetic shield 503 can be constructed from mu-metal or another suitable shielding material. Magnetic field generator 507 can be disposed within magnetic shield 503. The polarization region of polarization chamber 502 can be disposed within magnetic shield 503. Magnetic shield 503 can enable application of a magnetic field of amplitude less than Earth magnetic field to a solution in the polarization transfer chamber 502. In certain embodiments, magnetic field generator 507 can enable setting a magnetic field in the polarization transfer chamber 502 to a specific value (or setting the magnetic field to follow a particular time-dependent amplitude trajectory). In certain embodiments, parahydrogenation chamber 501 can be at least partially outside magnetic shield 503, as shown in FIG. 5A. Alternatively, parahydrogenation chamber 501 can be inside magnetic shield 503 (e.g., a single reservoir can combine functions of parahydrogenation chamber 401 and polarization transfer chamber 402).

Polarizer 500 can include a radiofrequency waveform generator (not shown in FIG. 5A). The radiofrequency waveform generator can be electrically coupled to magnetic field coils 407. The radiofrequency waveform generator can be configurable to apply a radiofrequency waveform to the one or more RF coils, thus generating an electromagnetic field within the polarization device. The radiofrequency waveform generator can be configured to generate a varying magnetic field amplitude in the magnetic shield to efficiently transfer the polarization.

In some embodiments, polarizer 500 can be used with a purification system configured to separate a purified fraction from the polarized solution. In some embodiments, the purification system can include separation system 506. Following polarization, a solution containing a polarized precursor (in PHIP of PHIP-SAH applications) or polarized target compound (in SABRE applications) can be conveyed to separation system 506. Separation system 506 can be configured to receive a solution containing a polarized precursor (in PHIP or PHIP-SAH applications) or polarized target compound (in SABRE applications). In some embodiments, separation system 506 can include a connection for transferring fluids automatically or manually from polarizer 500 (e.g., a fluid manifold or other suitable connection). Separation system 506 can be or include a precipitation chamber, as detailed in section "Purification and Separation". In some embodiments, the purification system can be configured to receive a cleavage solution. The cleavage solution can cleave the sidearm from the hyperpolarized parahydrogenated precursor, thereby generating the hyperpolarized target compound. As described herein, the cleavage solution can induce a hydrolysis reaction that separates the target compound from the remainder of the precursor molecule. In some embodiments, the cleavage solution can be configured to change the pH of the solution containing the hyperpolarized parahydrogenated precursor. In some embodiments, the redissolution chamber, detailed in section "Purification and Separation", can be a chamber in separation system 506. Accordingly, following extraction and purification of the hyperpolarized target compound, the hyperpolarized target compound can be dissolved in a biocompatible solvent, preferably an aqueous solvent. In various embodiments, a liquid-liquid extraction between an organic phase and an aqueous phase can be performed by separation system 506. Such a liquid-liquid extraction can be used to cleave the parahydrogenated precursor from the side arm to produce the target compound, as well as separate the target compound from catalysts, cleavage byproducts, or organic solvent(s) used for the hydrogenation or polarization transfer. In some embodiments, a fluorinated phase may be used in addition to/in alternative of the organic phase, and may be combined with an aqueous phase for improved separation. In some other embodiments, purification step may include catalyst scavenging. Such catalyst scavenging can include adding a binding material which binds preferentially to the catalyst, with the binding material subsequently being separated by filtration, centrifugation, or other mechanical means. In some embodiments, the hyperpolarized molecules may be cleaved to produce the target compounds inside separation system 506. In some embodiments, pH level and temperature of the sample may be monitored and controlled in separation system 506 in order to meet conditions for injection into the patient. Alternatively, a quality control system (similar to quality control system 613) can be used monitor the characteristics of the sample. The sample can be injected to an animal or a human patient for hyperpolarized MRI scan in an MRI scanner (e.g., such as in MRI system 612).

The disclosed embodiments are not limited to embodiments including magnetic shield 503. In some embodiments (e.g., embodiments in which suitable polarization transfer can occur in the ambient magnetic field), polarizer 500 can omit magnetic shield 503.

FIG. 5B depicts a polarizer 510, consistent with disclosed embodiments. Polarizer 510 can include a hydrogenation device, polarization device, radiofrequency waveform generator, and purification system similar in design and functionality to those described above with regards to FIG. 5A.

Consistent with disclosed embodiments, polarizer 510 can include a hydrogenation device similar to the hydrogenation device of polarizer 500. In some embodiments, the hydrogenation device of polarizer 510 can include a parahydrogenation chamber 511 similar to parahydrogenation chamber 501. In some embodiments, the hydrogenation device of polarizer 510 can optionally include heater coils 515 similar to heater coils 505.

Consistent with disclosed embodiments, polarizer 510 can include a polarization device similar to the polarization device of polarizer 510 In some embodiments, the polarization device of polarizer 510 can include a polarization chamber 512 similar to polarization chamber 502. Polarization chamber 512 can have a volume, configuration, or the like, similar to that described with regards to polarization chamber 502.

Consistent with disclosed embodiments, the polarization device of polarizer 510 can include a magnetic field generator 517 similar to the magnetic field generator 507. Magnetic field generator 517 can modulate the magnetic field across a specified range between 0 and 500 mT within polarization chamber 512 (or the polarization region thereof). In some embodiments, magnetic field generator 517 can provide a constant magnetic field. In some embodiments, magnetic field generator 517 can modulate the magnetic field.

In various embodiments, the magnetic field generator 517 can include an electromagnet or permanent magnet capable of generating a magnetic field greater than 0.1 mT, 0.2 mT, 0.3 mT, 0.4 mT, 0.5 mT, 0.6 mT, 0.7 mT, 0.8 mT, 0.9 mT, 1.0 mT, 2.0 mT, 3.0 mT, 4.0 mT, 5.0 mT, 6.0 mT, 7.0 mT, 8.0 mT, 9.0 mT, 10 mT, 20 mT, 30 mT, 40 mT, 50 mT, 60 mT, 70 mT, 80 mT, 90 mT, 100 mT, 200 mT, 300 mT, 500 mT; or less than about 500 mT, 300 mT, 200 mT, 100 mT, 90 mT, 80 mT, 70 mT, 60 mT, 50 mT, 40 mT, 30 mT, 20 mT, 10 mT, 9 mT, 8 mT, 7 mT, 6 mT, 5 mT, 4 mT, 3 mT, 2 mT, 1 mT, 0.9 mT, 0.8 mT, 0.7 mT, 0.6 mT, 0.5 mT, 0.4 mT, 0.3 mT, 0.2 mT, 0.1 mT or less. The magnetic field can be applied to the sample in polarization chamber 512.

In some embodiments, the polarization device of polarizer 510 can include a magnetic shield 513 similar to magnetic shield 503. Similar to magnetic shield 503, magnetic shield 513 can be constructed from mu-metal or another suitable shielding material. Magnetic field generator 517 can be disposed within magnetic shield 513. The polarization region of polarization chamber 512 can be disposed within magnetic shield 513. Magnetic shield 513 can enable application of a magnetic field of amplitude less than Earth magnetic field to a solution in the polarization transfer chamber 512.

In some embodiments, RF coils 514 can be configured to generate a radiofrequency waveform on the sample in the chamber for polarization transfer. As used herein, a radiofrequency waveform additionally includes audio frequency waveforms. Accordingly, the radiofrequency waveform can be from 20 Hz to 200 kHz, or from 1 Hz to 1 MHz. In various embodiments, the waveform is configured to be a polarization transfer waveform relevant for transferring polarization on the sample. The polarization transfer waveform can be chosen according to the type of compound, the magnetic field, and whether the compound is polarized by PHIP, PHIP-SAH, or SABRE methods, as described herein. In various embodiments (not shown in FIG. 5B), the RF coils 514 can be the same coils or include the same coils used in the magnetic field generator 517 to generate the static magnetic field. In various embodiments, the magnetic field generator 517 can be a solenoid and the RF coils 514 can be disposed as saddle coils around the solenoid (not shown in FIG. 5B). In various embodiments RF coils 514 can generate an oscillating electromagnetic field where the magnetic field has a component which is perpendicular to the static magnetic field. In various embodiments RF coils 514 can be configured to generate a circularly polarized magnetic field, for example using two perpendicular sets of coils. In some embodiments, during application of a polarization waveform by RF coils 514, magnetic shield 513 can be configured to maintain a magnetic field strength within the polarization chamber of at least about 10 mT, 20 mT, 40 mT, 80 mT, 160 mT, 200 mT, 250 mT, 500 mT, 1000 mT, or more; 1000 mT, 500 mT, 250 mT, 200 mT, 160 mT, 80 mT, 40 mT, 20 mT, 10 mT, or less; or within a range defined by any two of the preceding values.

Polarizer 510 can include a radiofrequency waveform generator similar to the RF waveform generator of polarizer 510. The radiofrequency waveform generator can be configurable to apply one or more radiofrequency waveforms for a predetermined period of time (e.g., between 0.5 and 30 seconds, or another suitable period of time). The radiofrequency waveforms can include a waveform having a frequency that is substantially constant during the period of time, a waveform having a frequency that varies substantially linearly (or substantially monotonically) during the period of time, a waveform an amplitude that is substantially constant during the period of time, and a waveform having an amplitude that varies substantially linearly (or substantially monotonically) over the period of time. One or more channels of the radiofrequency waveform generator can be electrically coupled to magnetic field generator 517 and can apply an radiofrequency waveform to magnetic field generator 517. One or more channels of the radiofrequency waveform generator can be electrically coupled to RF coils 514. In various embodiments, the one or more channels connected to the RF coils 514 are configured to generate a radiofrequency waveform during polarization transfer.

The radiofrequency electromagnetic field generated by the RF coils 514 can be used to perform a polarization transfer to the target nuclear spins in the polarization chamber 512 of a sample volume of at least about 10 mL, 20 mL, 30 mL, 40 mL, 50 mL, 60 mL, 70 mL, 80 mL, 90 mL, 100 mL, 200 mL, 300 mL, 400 mL, 500 mL, 600 mL, 700 mL, 800 mL, 900 mL, 1000 mL, or more; 1000 mL, 900 mL, 800 mL, 700 mL, 600 mL, 500 mL, 400 mL, 300 mL, 200 mL, 100 mL, 90 mL, 80 mL, 70 mL, 60 mL, 50 mL, 40 mL, 30 mL, 20 mL, 10 mL, or less; or within a range defined by any two of the preceding values.

In certain embodiments where the parahydrogenation chamber 511 is the polarization chamber 512, a continuous wave irradiation or pulses can be generated by the RF coils 514 during hydrogenation in order to decouple the parahydrogenated protons from deuterium or $^{13}C$ spins during the hydrogenation.

In certain embodiments the radiofrequency waveform can include pulses, frequency sweeps, or amplitude sweeps for performing the polarization transfer as described in section "polarization transfer". In certain embodiments, for example in SABRE polarization, the radiofrequency waveform in the polarization chamber 402 can be kept at a constant amplitude or amplitude range less than about 1 µT, 2 µT, 3 µT, 4 µT, 5 µT, 6 µT, 7 µT, 8 µT, 9 µT, 10 µT, 20 µT, 30 µT, 40 µT, 50 µT, 60 µT, 70 µT, 80 µT, 90 µT, 100 µT, 200 µT, 300 µT, 400 µT, 500 µT, 600 µT, 700 µT, 800 µT, 900 µT, 1000 µT, or greater; a constant value or range greater than about 1000 µT, 900 µT, 800 µT, 700 µT, 600 µT, 500 µT, 400 µT, 300 µT, 200 µT, 100 T, 90 µT, 80 µT, 70 µT, 60 µT, 50 µT, 40 µT, 30 µT, 20 µT, 10 µT, 9 µT, 8 µT, 7 µT, 6 µT, 5 µT, 4 µT, 3 µT, 2 µT, 1 µT, or less; or within a range defined by any two of the preceding values. The amplitude of the radiofrequency waveform in the polarization chamber 402 can be kept at the constant value or range for at least about 1 second, 2 seconds, 3 seconds, 4 seconds, 5 seconds, 6 seconds, 7 seconds, 8 seconds, 9 seconds, 10 seconds, 20 second, 30 seconds, 40 seconds, 50 seconds, 60 seconds or more; at most about 60 seconds, 50 seconds, 40 seconds, 30 seconds, 20 seconds, 10 seconds, 9 seconds, 8 seconds, 7 seconds, 6 seconds, 5 seconds, 4 seconds, 3 seconds, 2 seconds, 1 second, or less; or within a range defined by any two of the preceding values.

Polarizer 510 can include a purification system similar to the purification system of polarizer 500. In some embodiments, the purification system can include a separation system similar to separation system 506 of polarizer 500. The separation system can be or include precipitation chamber 516. Following polarization, a solution containing a polarized precursor (in PHIP or PHIP-SAH applications) or polarized target compound (in SABRE applications) can be conveyed to separation system 516. Separation system 516 can be configured to receive a solution containing a polarized precursor (in PHIP or PHIP-SAH applications) or polarized target compound (in SABRE applications). In some embodiments, separation system 506 can include a connection for transferring fluids automatically or manually from polarizer 500 (e.g., a fluid manifold or other suitable connection). In some embodiments, the purification system can be configured to receive a cleavage solution, similar to the purification system of polarizer 500. In some embodiments, the redissolution chamber be a chamber in separation system 516, similar to separation system 506 of polarizer 500. In various embodiments, a liquid-liquid extraction between an organic phase and an aqueous phase can be performed by separation system 516, similar to separation system 506 of polarizer 500. In some embodiments, a fluorinated phase may be used in addition to/in alternative of the organic phase, and may be combined with an aqueous phase for improved separation. In some other embodiments, purification step may include catalyst scavenging. In some embodiments, the hyperpolarized molecules may be cleaved to produce the target compounds inside separation system 516. In some embodiments, pH level and temperature of the sample may be monitored and controlled in separation system 516 in order to meet conditions for injection into the patient. Alternatively, a quality control system (similar to quality control system 613) can be used monitor the characteristics of the sample. The sample can be injected to an animal or a human patient for hyperpolarized MRI scan in an MRI scanner (e.g., such as in MRI system 612).

The disclosed embodiments are not limited to embodiments including magnetic shield 513. In some embodiments (e.g., embodiments in which suitable polarization transfer can occur in the ambient magnetic field), polarizer 510 can omit magnetic shield 513.

FIG. 5C depicts a polarizer 520, consistent with disclosed embodiments. Polarizer 520 can include a magnetic shield 561. Magnetic shield 561 can be constructed from mu-metal or another suitable shielding material. Similar to magnetic shield 503, magnetic shield 561 can enable setting a magnetic field within magnetic shield 561 to a specific value or trajectory. Polarizer 520 can include polarization chamber 541. As depicted in FIG. 5C, the polarization chamber can penetrate through magnetic shield 561, allowing an NMR tube 551 (or a larger-volume vessel) containing a sample 553 to be placed within magnetic shield 561. In embodiments using polarization device 530, the polarization can occur in a region of the polarization chamber located within the shield, the solenoid, and the saddle coil (e.g., the region containing the sample in the NMR tube or larger-volume vessel). In PHIP or PHIP-SAH embodiments, sample 553 can be a solution containing a precursor (prior to parahydrogenation) or parahydrogenated precursor. In SABRE embodiments, sample 553 can be a solution containing a target compound (and optionally a hydrogenation catalyst). Solenoid 543 can be wrapped around polarization chamber 541. Solenoid 543 can penetrate through magnetic shield 561. Solenoid 543 can be conductive (e.g., copper) and can be energized to provide a magnetic field along the z-axis of polarizer 530. Saddle coil 571 can be disposed within magnetic shield 561 and around Solenoid 541. Saddle coil 571 can be conductive (e.g., copper) and can be energized to provide a magnetic field transverse to the field generated by solenoid 543 (e.g., in the x-y plane). Consistent with disclosed embodiments, solenoid 543 can be electrically connected to a radiofrequency waveform generator (not shown). Driven by the radiofrequency waveform generator, solenoid 543 can be a magnetic field generator similar to magnetic field generator 507 or magnetic field generator 517. Consistent with disclosed embodiments, saddle coil 571 can be electrically connected to the radiofrequency waveform generator (or another radiofrequency generator). Driven by the radiofrequency waveform generator, saddle coil 571 can be a radiofrequency field generator similar to RF coils 514.

In some embodiments, polarizer 520 can be used with a purification system configured to separate a purified fraction from the polarized solution. In some embodiments, the purification system can include separation system, similar to separation systems 506 or 516.

FIG. 6A depicts an exemplary schematic of a system for production of hyperpolarized target compounds, consistent with disclosed embodiments. The system can include a polarizer 600, precipitation chamber 606, transport device 610, redissolution system 611, MRI system 612, and quality control system 613. In some embodiments, at least one of transport device 610 and quality control system 613 can be omitted.

Polarizer 600 can be, or be similar to, one of polarizer 500, polarizer 510, and polarizer 520. Polarizer 600 can be used with a purification system that include precipitation chamber 606 and magnetic field generator 608. Precipitation chamber 606 can resemble precipitation chamber 403, discussed with regards to FIG. 4. Magnetic field generator 608, which can be a permanent magnet or electromagnet can apply a magnetic field of greater than about 1 mT, 10 mT, 100 mT, 1000 mT or more; or less than about 1000 mT, 100 mT, 10 mT, 1 mT, or less, to at least a portion of the precipitate in the precipitation chamber 606.

In some embodiments, following precipitation, the precipitate can be transported to a different location in transport device 610, which can include a magnetic field generator and cooling system as described herein. The magnetic field generator include a permanent or electromagnet configured to apply about 1 mT, 10 mT, 100 mT, 1000 mT or more; or less than about 1000 mT, 100 mT, 10 mT, 1 mT, or less, to at least some of the precipitated particles in the transport device 610. The hyperpolarized particles can be transported to a redissolution system 611, as detailed herein, where the precipitate can be redissolved in a biocompatible solvent, preferably an aqueous solvent. In some embodiments, the redissolution system can be part of the purification system. For example, following purification the polarized precursor or polarized target compound can be redissolved (e.g., from a precipitate) prior to transport in transport device 610. In various embodiments, the purified polarized precursor can be redissolved, then cleaved to form the polarized target compound. The polarized target compound can then be separated and transported in transport device 610.

Following extraction and purification, solution properties can be monitored in quality control system 613. In a preferred embodiment, the quality control system monitors the pH and temperature of the solution (e.g., the redissolved solution produced by redissolution system 611, containing the hyperpolarized target compound). In some embodiments, the quality control system 613 can additionally monitor the solution includes trace amounts of the original solvent in which the parahydrogen was dissolved. Such monitoring can be performed by, for example, a UV/VIS spectrometer. The solution containing the hyperpolarized target compound can be injected into an animal or a human patient for hyperpolarized MRI scan in an MRI system 612.

Exemplary Polarization Transfer in Parahydrogenated Cinnamyl Pyruvate

The systems and methods described herein were applied to transfer polarization from parahydrogen protons to a $^{13}$C-labeled cinnamyl pyruvate precursor. The cinnamyl pyruvate precursor featured a carbon-carbon triple bond located three bonds away from the $^{13}$C target atom. Thus, when the cinnamyl pyruvate precursor was parahydrogenated across the triple bond, the parahydrogen protons were incorporated four bonds and five bonds away from the $^{13}$C target atom. The following demonstrates the utility of the systems and methods presented herein for transferring polarization from parahydrogen protons to a the target nucleus located at least four chemical bonds away.

A method based on RF sweeps to transfer the singlet spin-order from parahydrogen protons after hydrogenation to polarization on a $^{13}$C nucleus was developed and compared to a method based on ultra-low magnetic field sweeps. Both RF sweeps and magnetic field sweeps rely on passing adiabatically through Level-Anti-Crossings (LACs) such that the initial population imbalance after hydrogenation results in $^{13}$C polarization.

The physical mechanism responsible for the $^{13}$C polarization is the adiabatic evolution of the system when the magnetic field or RF amplitude is swept sufficiently slowly. The eigenvalues of interest are the lowest ones, which are over-populated after hydrogenation (when the swept parameter, e.g. amplitude for RF pulses or magnetic field for magnetic field sweeps, is 0), owing to $J_{12}$ being the largest J-coupling in the system (as described above with regards to FIGS. 2A and 2B). During the sweep, when the swept parameter, e.g. amplitude for RF pulses or magnetic field for magnetic field sweeps, becomes large enough to cross the LAC conditions, the low energy states correspond to the states where the $^{13}$C polarization is aligned with the field. Thus, at the end of the sweep the over-populated states are states where the target $^{13}$C spin is polarized, leading to a total $^{13}$C polarization.

Specifically for RF sweeps, the swept parameter is $\Omega$ the amplitude of the RF. After hydrogenation, the system's eigenstates are populated according to their overlap with the parahydrogen proton's singlet state. Since $J_{12}$ is the largest J-coupling in the system, the most populated eigenstates are those with lowest energy. For sufficiently large $\Omega$, for example significantly higher than the values for the LAC condition detailed in section "Transfer of Polarization Using Mediating Spins", at the end of the sweep, the carbon polarization determines the lowest energy eigenstates. Thus, if the RF amplitude is swept sufficiently slowly, such that the dynamics are adiabatic, the overpopulated eigenstates have the same carbon polarization. In some embodiments, the RF amplitude need only be swept slowly at the vicinity of the Level-Anti-Crossings (LACs), where state population transfer takes place.

Methods

The low static magnetic field used in the experiments described was generated using a double layered solenoid piercing through a mu-metal magnetic shield (MS-2, twin-leaf, USA) along the z-direction. This configuration allowed the generation of fields up to 100 µT, The homogeneity of the field was measured to be 10 nT over the sample volume using a Fluxgate magnetometer (Stefan Mayer instruments, Germany). The coil was powered using a common laboratory power supply, with the output attenuated over a 1 kHz high-power resistor. The RF excitation fields were generated using the built-in shim coils of the MS-2 shield perpendicular to the static magnetic field. The RF signals were generated by a NI-card (National Instruments 6363-USB) and amplified using an audio amplifier. The amplitude of the RF field was measured with the same Fluxgate sensor (Stefan Mayer instruments, Germany).

A catalyst solution containing 3 mg/ml of Rh(dppb) (COD) catalyst precursor was prepared. This solution was subsequently mixed with a solution containing the precursor to the target compound, forming the desired PHIP or PHIP-SAH molecules. For the experiments yielding cinammyl pyruvate, a solution of 25 mM of 1-$^{13}$C cinnamylpropargylpyruvate precursor was prepared.

The samples were bubbled at room temperature under a parahydrogen atmosphere of 2.5 bar for 60 s. The hydrogenation was carried out in the laboratory magnetic field (approximately 50 µT) under elevated temperatures (55 degrees for solutions using acetone-d6 as the solvent and 90 degrees for D2O as the solvent).

An RF sweep or magnetic field sweep was then performed. As may be appreciated, other methods for transferring polarization using adiabatic and diabatic RFS are possible, as described herein.

Consistent with disclosed embodiments, the RF sweeps were performed as depicted in FIGS. 6B to 6D. The RF frequency was first increased from zero to approximately 20 Hz to ensure that the populations of the spin system went through the relevant Level Anti-Crossings (LACs). Then, during a first phase of the RF sweep, the RF frequency was kept on resonance with the $^{13}$C Larmor frequency at a magnetic field of 100 µT while the RF amplitude was linearly increased. When not stated otherwise, the duration of the first phase was 8 seconds. In the second phase of the RF sweep, the RF frequency was linearly increased to 70 Hz more than the $^{13}$C Larmor frequency and the RF amplitude was linearly reduced to zero. The duration of the second phase was 2 seconds.

Consistent with disclosed embodiments, the magnetic field sweeps included a first, second, and third phase. In the first phase, the sample was either kept at a static field of 10 µT or inserted into the polarizer at 10 µT, In the second phase, the magnetic field was diabatically dropped to 50 nT. In the third phase, the magnetic field was linearly raised to 1 µT, When not stated otherwise, the duration of the third phase was 8 seconds.

After performance of the RF sweep or magnetic field sweep, the sample was carried to a bench top NMR spectrometer (Fourier 80, Bruker, USA) where the 13C NMR spectrum was acquired. To estimate the polarization, the proton thermal signal was measured in a high-field spectrometer (Bruker 400 MHz) and the sample concentration was calculated using an external reference. The polarization was determined by comparing the signal to the thermal signal of a reference sample (1-$^{13}$C Methanol, 99.4 percent labeled). This approach to estimation of the polarization was validated by comparison of the calculated polarization to that obtain in reference to the acquisition of the fully relaxed $^{13}$C spectrum of the highly concentrated $^{13}$C labeled molecules used in this study.

Results

Figure 7A:
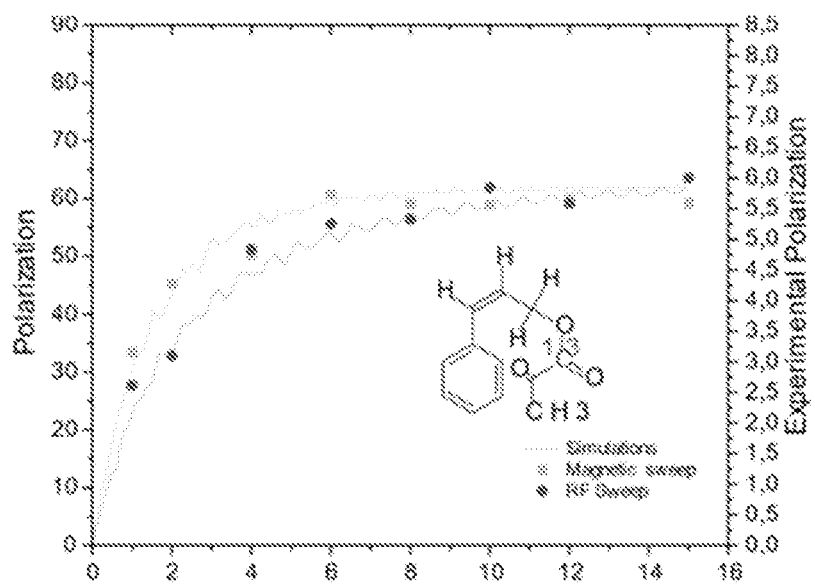
FIGS. 7A and 7B depict simulations and experimental results for polarization transfer using protonated and deuterated cinnamyl pyruvate molecules, in accordance with disclosed embodiments.
Figure 7B:
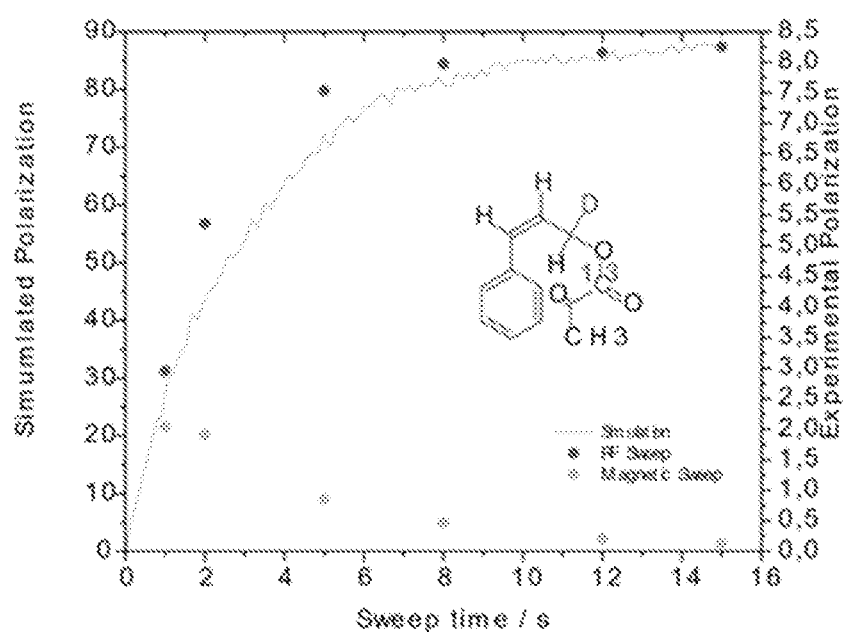

FIGS. 7A and 7B depict simulations and experimental results for polarization transfer using protonated and deuterated cinnamyl pyruvate molecules. FIG. 7A depicts polarization transfer to cinnamyl pyruvate with a mediating proton spin connecting the carboxylic $^{13}$C spin with the parahydrogen protons. For this spin system, RF sweeps and MFC perform comparably. As the duration of the first phase of the RF sweep increased, the polarization transferred increased and then plateaued, reaching approximately 60% polarization transfer efficiency with a first phase duration of 15 seconds. Similar experimental results were achieved for magnetic field sweeps. Simulations of these experiments show excellent agreement with the experimental results, describing both the rise of the polarization and eventual plateau.

FIG. 7B depicts polarization transfer to Cinnamyl Pyruvate d1 with a mediating deuteron spin connecting the carboxylic $^{13}$C spin with the parahydrogen protons. Polarization transfer efficiency using RF sweeps is increased by approximately 40 percent, as compared with the protonated molecule. The RF sweeps achieved polarization transfer efficiency that plateaued at approximately 90%. Simulations of the RF sweep experiments (which omitted relaxation effects) showed excellent agreement with experimental results. Relaxation did not appear to be an issue at/on the timescales investigated but would presumably limit the transfer efficiency at longer times. The magnetic sweeps did not achieve the same degree of polarization as the RF sweeps. As the duration of the magnetic sweeps was increased, the polarization achieved decreased. These results are in accordance with predictions that rapid deuterium relaxation would inhibit the transfer of polarization to the target $^{13}$C atom. When RF sweeps were used, no polarization was transferred to the deuterium and scalar relaxation of the second kind was effectively avoided. These effects combine to allow significantly higher polarization. The theoretical efficiency of the sweeps on the deuterated molecule is a factor of almost 1.5 higher than the protonated, as all the states are accessible. This higher theoretical efficiency was borne out in the experiment where the polarization reached 8.25% for deuterated cinnamyl pyruvate compared to 6.0% protonated cinnamyl pyruvate, giving a factor of 1.375. The transfer speeds needed to ensure the transfer was adiabatic were similar to those of the magnetic field sweeps and so were the relaxation rates.

Figure 7C:
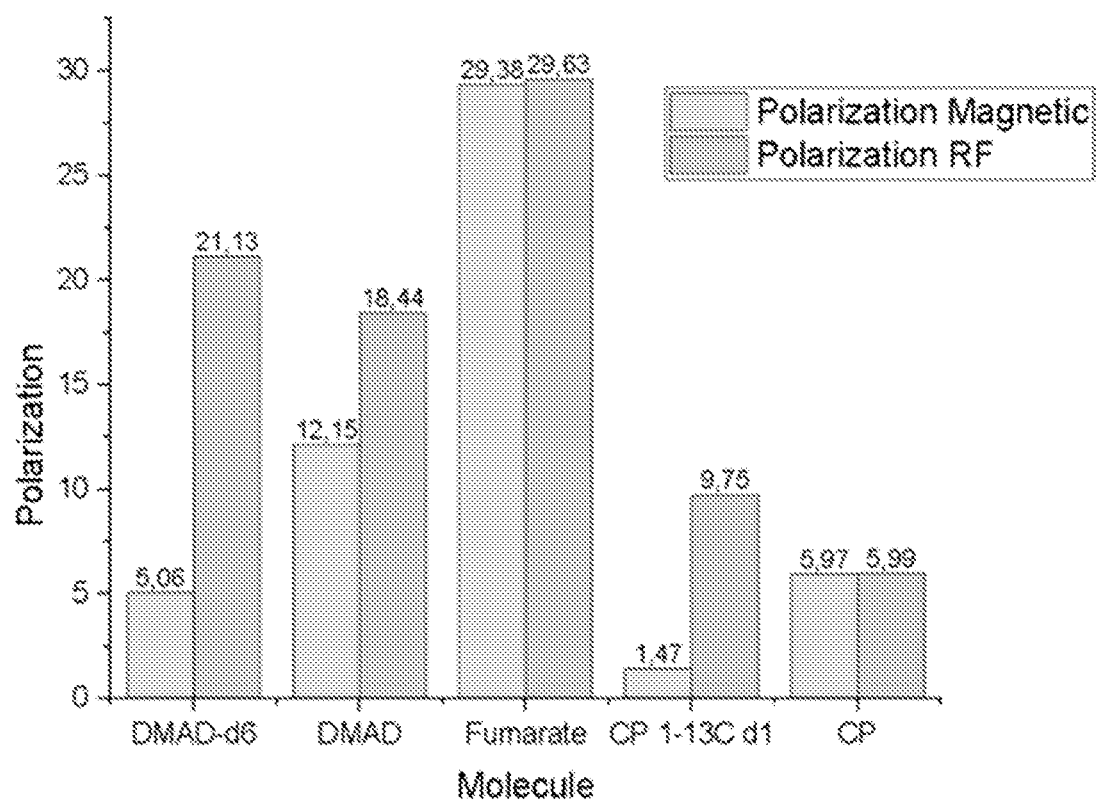
FIG. 7C depicts the polarization achieved for DAMD-d6, DMAD, Fumarate, CP 1-13C d1, and CP, in accordance with disclosed embodiments.

FIG. 7C depicts the polarization achieved for DAMD-d6, DMAD, Fumarate, CP 1-13C d1, and CP, in accordance with disclosed embodiments. For all the molecules studied, the RF sweeps either produced comparable levels of polarization to the magnetic field sweeps or exceeded them. Here, the hydrogenation was conducted in a water bath heated to 60 degrees (except for the case of fumarate, where it was heated to 90 degrees). The laboratory field during hydrogenation was approximately 50 µT.

Exemplary Polarization Transfer in Large Volume:

A 2 ml solution of acetone-d6 containing 100 mM of starting material and 5 mM of catalyst was heated in a ETFE coated aluminum reactor vessel. After reaching a temperature of 55 degrees, the sample was exposed to a parahydrogen atmosphere of 10 bars and bubbled with parahydrogen for 30 seconds. Subsequently, the solution was transferred to a container located inside the polarization transfer device where it was diluted with 23 ml of acetone. A static magnetic field of 0.1 mT was used as a guiding field for sample transport and also for the subsequent polarization transfer. Subsequently, the amplitude of a RF field on resonance with the 13C NMR resonance frequency was ramped up from 0 to 4 µT within 5 s. The ramp up of the amplitude was followed by a 2 s adiabatic 90 degree point to point rotation to orient the generated hyperpolarized magnetization parallel to the static magnetic field. The adiabatic rotation was performed by a simultaneous ramp down of the amplitude and increase of the RF frequency as described in the previous experiment. Subsequently, 0.6 ml of the sample solution was extracted and the 13C signal measured by a 60 MHz tabletop spectrometer.

Figure 8:
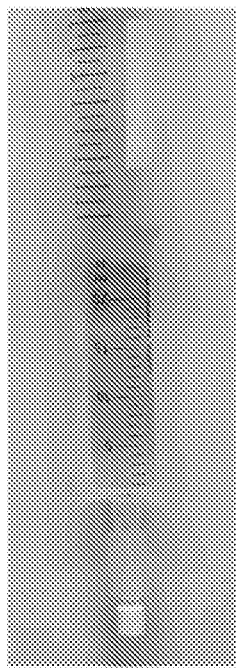
FIG. 8 depicts a polarized 25 ml sample of 1-$^{13}C$ cinnamyl pyruvate prepared in accordance with disclosed embodiments.
Figure 9:
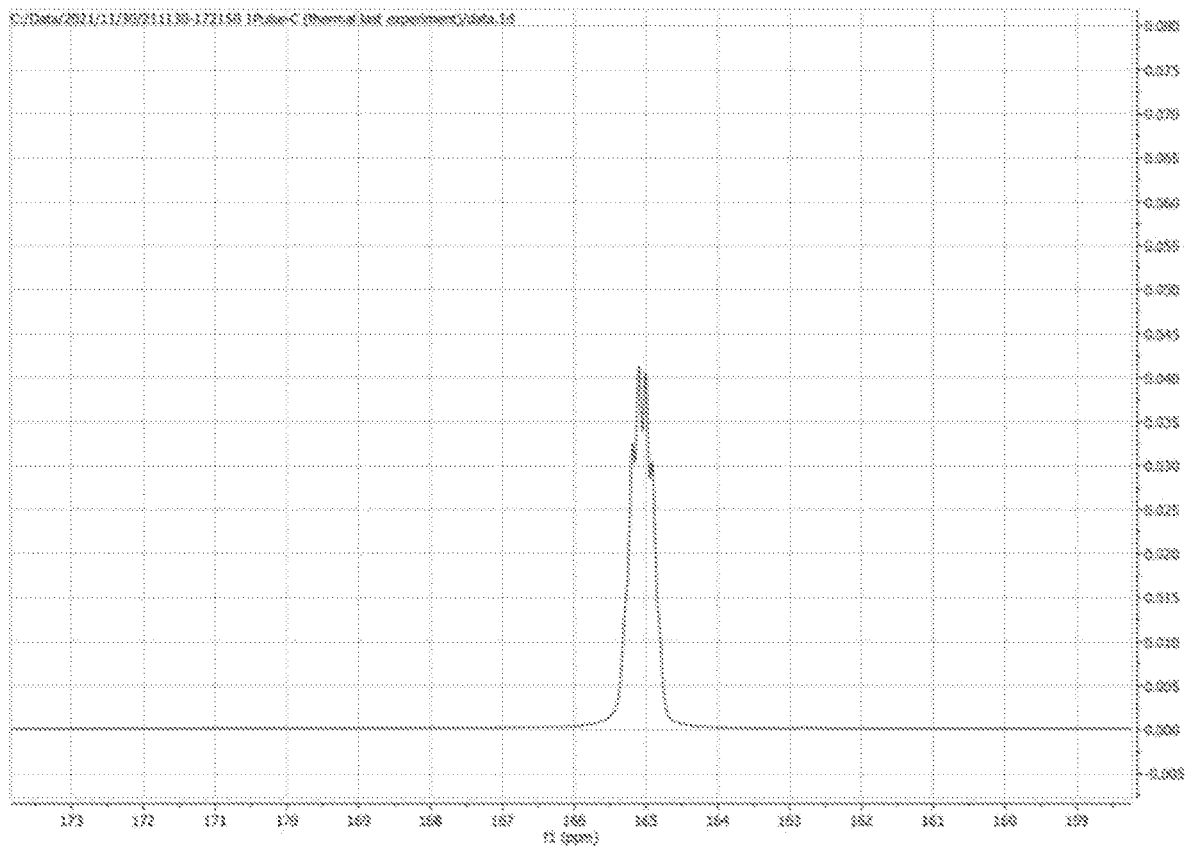
FIG. 9 depicts a $^{13}C$ NMR spectrum measured in a 60 MHz SpinSolve spectrometer of the polarized $^{13}C$-enriched cinnamyl pyruvate depicted in FIG. 8.

FIG. 8 depicts a polarized 25 ml sample of 1-$^{13}$C cinnamyl pyruvate prepared in accordance with disclosed embodiments. FIG. 9 depicts a $^{13}$C NMR spectrum measured in a 60 MHz SpinSolve spectrometer of the polarized $^{13}$C-enriched cinnamyl pyruvate depicted in FIG. 8.

The foregoing description has been presented for purposes of illustration. It is not exhaustive and is not limited to precise forms or embodiments disclosed. Modifications and adaptations of the embodiments will be apparent from consideration of the specification and practice of the disclosed embodiments. For example, the described implementations include hardware, but systems and methods consistent with the present disclosure can be implemented with hardware and software. In addition, while certain components have been described as being coupled to one another, such components may be integrated with one another or distributed in any suitable fashion.

Embodiments herein include systems, methods, and tangible non-transitory computer-readable media. The methods may be executed, at least in part for example, by at least one processor that receives instructions from a tangible non-transitory computer-readable storage medium. Similarly, systems consistent with the present disclosure may include at least one processor and memory, and the memory may be a tangible non-transitory computer-readable storage medium. As used herein, a tangible non-transitory computer-readable storage medium refers to any type of physical memory on which information or data readable by at least one processor may be stored. Examples include random access memory (RAM), read-only memory (ROM), volatile memory, non-volatile memory, hard drives, CD ROMs, DVDs, flash drives, disks, registers, caches, and any other known physical storage medium. Singular terms, such as "memory" and "computer-readable storage medium," may additionally refer to multiple structures, such a plurality of memories or computer-readable storage media. As referred to herein, a "memory" may comprise any type of computer-readable storage medium unless otherwise specified. A computer-readable storage medium may store instructions for execution by at least one processor, including instructions for causing the processor to perform steps or stages consistent with embodiments herein. Additionally, one or more computer-readable storage media may be utilized in implementing a computer-implemented method. The term "non-transitory computer-readable storage medium" should be understood to include tangible items and exclude carrier waves and transient signals.

Moreover, while illustrative embodiments have been described herein, the scope includes any and all embodiments having equivalent elements, modifications, omissions, combinations (e.g., of aspects across various embodiments), adaptations or alterations based on the present disclosure. The elements in the claims are to be interpreted broadly based on the language employed in the claims and not limited to examples described in the present specification or during the prosecution of the application, which examples are to be construed as nonexclusive. Further, the steps of the disclosed methods can be modified in any manner, including reordering steps or inserting or deleting steps.

The features and advantages of the disclosure are apparent from the detailed specification, and thus, it is intended that the appended claims cover all systems and methods falling within the true spirit and scope of the disclosure. As used herein, the indefinite articles "a" and "an" mean "one or more." Similarly, the use of a plural term does not necessarily denote a plurality unless it is unambiguous in the given context. Further, since numerous modifications and variations will readily occur from studying the present disclosure, it is not desired to limit the disclosure to the exact construction and operation illustrated and described, and accordingly, all suitable modifications and equivalents may be resorted to, falling within the scope of the disclosure.

The Embodiments May Further be Described Using the Following Clauses

1. A system for generating a hyperpolarized molecule, comprising: a hydrogenation device configured to generate a parahydrogenated solution by mixing a solvent, parahydrogen gas, and a precursor of the hyperpolarized molecule, the precursor comprising an unsaturated chemical bond; a polarization device configured to generate a polarized solution containing the hyperpolarized molecule using the parahydrogenated solution, the polarization device comprising: (a) a polarization chamber configured to receive the parahydrogenated solution, the polarization chamber including a polarization region having a volume of at least 10 milliliters (mL); (b) one or more radiofrequency (RF) coils disposed around the polarization region of the polarization chamber; and (c) a magnetic field source disposed around the polarization region of the polarization chamber and configured to provide a mean magnetic field strength of at most 200 millitesla (mT); an RF waveform generator coupled to the one or more RF coils of the polarization device, the RF waveform generator configurable to apply an RF waveform to the one or more RF coils; and a purification system configured to separate a purified fraction from the polarized solution.

2. The system of clause 1, further comprising a dissolution chamber configured to contain the purified fraction and to receive a second solvent for dissolving the purified fraction.

The system of clause 1 or 2, wherein the polarization device comprises a magnetic shield, the magnetic shield disposed around the polarization region of the polarization chamber.

4. The system of any one of clauses 1-3, wherein the magnetic shield is configured to maintain a magnetic field strength within the polarization chamber at less than 200 mT during application of the polarization waveform to the one or more RF coils.

5. The system of any one of clauses 1-4, wherein the hydrogenation device comprises a bubbler configured to introduce the parahydrogen gas into the solvent; a membrane configured to enable diffusion of the parahydrogen gas into the solvent; or an aerosolizer configured to spray droplets of the solvent into a parahydrogen chamber configured to receive the parahydrogen gas.

6. The system of any one of clauses 1-5, wherein the precursor of the target compound comprises the target compound chemically coupled to a sidearm containing the unsaturated chemical bond.

7. The system of clause 6, wherein the precursor of the target compound comprises an ester of the target compound.

8. The system of clause 6 or 7, wherein the purification system is configured to receive a cleavage solution configured to cleave the sidearm from the precursor of the target compound, thereby generating the target compound.

9. The system of any one of clauses 1-8, wherein the purification system comprises a separation system, wherein the purified fraction of the polarized solution comprises a precipitated fraction of the polarized solution, and wherein the separation system is configured to separate the precipitated fraction of the hyperpolarized molecule from the polarized solution.

10. The system of clause 9, wherein the dissolution chamber is configured to contain the precipitated fraction and to receive a second solvent for dissolving the precipitated fraction.

11. The system of any one of clauses 1-10, wherein the RF waveform generator is configurable to apply the RF waveform for a predetermined period of time and wherein the RF waveform comprises at least one of: a frequency that is substantially constant during the period of time, a frequency that varies substantially linearly during the period of time, an amplitude that is substantially constant during the period of time, or an amplitude that varies substantially linearly over the period of time.

12. A method for increasing a nuclear spin polarization in a target compound, comprising: (a) obtaining a target compound or parahydrogenated precursor of the target compound comprising at least: (i) a first proton, (ii) a second proton coupled at least to the first proton by a first J-coupling constant, the first and second proton having a singlet spin order, (iii) a third proton coupled at least to one of the first proton or the second proton by a second J-coupling constant, and (iv) a target atom coupled to at least the third proton by a third J-coupling constant, wherein the first and second protons are separated from the target atom by at least four chemical bonds; (b) placing the target compound or parahydrogenated precursor within a mean magnetic field strength below 500 mT; and (c) applying a magnetic resonance (MR) pulse sequence to the target compound or parahydrogenated precursor, the MR pulse sequence configured to transfer population from the first and second protons to the target atom, thereby imparting a non-equilibrium nuclear spin polarization of at least 1%, 2%, 5%, 10%, or 20% to the target atom.

13. The method of clause 12, wherein the first, second, and third protons form a quantum mechanical three-body system having highly-populated energy eigenstates and lowly-populated energy eigenstates.

14. The method of clause 13, wherein multiple eigenstates are highly populated.

15. The method of clause 13 or 14, wherein the MR pulse sequence is configured to transfer population from the highly-populated energy eigenstates to the lowly-populated energy eigenstates, thereby imparting a non-equilibrium nuclear spin polarization of at least 1%, 2%, 5%, 10%, or 20% to the target atom.

16. The method of any one of clauses 13-15, wherein, prior to (b), the highly-populated energy eigenstates have a combined population of at least 50%, 60%/6, 70%, 80%, or 90%.

17. The method of any one of clauses 12-16, further comprising, prior to (a), imparting the singlet spin order to the first and second protons.

18. The method of clause 17, wherein imparting the singlet spin order to the first and second protons comprises performing a parahydrogen-induced polarization (PHIP) reaction between parahydrogen and a precursor, thereby adding the first proton and the second proton across an unsaturated bond of the precursor to form the parahydrogenated precursor.

19. The method of clause 18, wherein the precursor of the compound comprises a sidearm containing the at least one unsaturated bond and at least the third proton, such that, subsequent to the PHIP reaction, the sidearm contains at least the first proton, the second proton, and the third proton.

20. The method of clause 19, further comprising cleaving the sidearm from the precursor to form the target compound.

21. The method of clause 20, wherein imparting the singlet spin order to the first and second protons comprises performing a signal amplification by reversible exchange (SABRE) reaction between parahydrogen and the target compound, thereby transferring polarization from the parahydrogen molecule to nuclei on the target compound.

22. The method of any one of clauses 12-21, wherein the first J-coupling constant is denoted $J_{12}$, the second J-coupling constant is denoted $J_{23}$, and the MR pulse sequence comprises at least one MR pulse having an amplitude of about $$\frac{1+a+s}{2} J_{12}$$

or about $sJ_{12}$, with $a=J_{23}/J_{12}$ and $s=\sqrt{1-a+a^2}$.

23. The method of any one of clauses 12-22, wherein the MR pulse sequence comprises a S2hM pulse sequence or a PulsePol pulse sequence.

24. The method of any one of clauses 12-23, wherein the parahydrogenated precursor or target compound further comprises at least a first carbon-12 atom covalently bonded to the first proton and a second carbon-12 atom covalently bonded to the first carbon-12 atom and to the second proton.

25. The method of any one of clauses 12-24, wherein the target atom is at least three bonds away from the third proton.

26. The method of any one of clauses 12-25, wherein the target atom is selected from the group consisting of: a carbon-13 atom, a nitrogen-15 atom, fluorine-19, and phosphorous-31.

27. The method of any one of clauses 12-26, wherein the first proton has a first Larmor frequency determined by the mean magnetic field strength, the second proton has a second Larmor frequency determined by the mean magnetic field strength, and the third proton has a third Larmor frequency determined by the mean magnetic field strength.

28. The method of clause 27, wherein a difference between the first and second Larmor frequencies, a difference between the first and third Larmor frequencies, or a difference between the second and third Larmor frequencies is less than twice the first J-coupling, twice the second J-coupling, or twice the third J-coupling.

29. The method of clause 27, wherein a difference between the first and second Larmor frequencies, a difference between the first and third Larmor frequencies, or a difference between the second and third Larmor frequencies is less than 20 Hertz (Hz).

30. The method of any one of clauses 12-29, wherein the precursor comprises a pyruvate ester containing at least one unsaturated bond, a precursor of fumarate containing at least one unsaturated bond, or a precursor of succinate containing at least one unsaturated bond.

31. The method of any one of clauses 12-30, wherein the MR pulse sequence comprises at least one radiofrequency field (RF) pulse having a predetermined duration, and wherein the at least one RF pulse comprises one or more of: a frequency that is substantially constant during the duration, a frequency that varies substantially linearly during the duration, an amplitude that is substantially constant during the duration, and an amplitude that varies substantially linearly over the duration.

32. A method for generating a hyperpolarized molecule, comprising: (a) obtaining a precursor of a molecule, the precursor comprising the molecule and a sidearm coupled to the molecule, the molecule comprising a target atom and the sidearm comprising at least one unsaturated chemical bond separated from the target atom by at least three intervening chemical bonds; (b) performing a parahydrogen-induced polarization (PHIP) reaction between parahydrogen and the precursor, thereby adding a first proton and a second proton across the at least one unsaturated bond and forming the molecule; (c) placing the molecule within a mean magnetic field strength between 0 and 500 mT; (d) applying a magnetic resonance (MR) pulse sequence to the molecule, the MR pulse sequence configured to transfer population from the first and second protons to the target atom, thereby imparting a non-equilibrium nuclear spin polarization of at least 1%, 2%, 5%, 10%, or 20% to the target atom; (e) cleaving the sidearm from the precursor to thereby generate the hyperpolarized molecule and a cleaved sidearm; (f) purifying the hyperpolarized molecule from the cleaved sidearm; (g) administering the hyperpolarized molecule to a subject; and (h) performing a hyperpolarized magnetic resonance imaging (MRI) procedure on the subject.

33. The method of clause 32, wherein the MR pulse sequence comprises a S2hM pulse sequence or a PulsePol pulse sequence.

34. The method of clause 32 or 33, wherein the target atom is selected from the group consisting of: a carbon-13 atom, a nitrogen-15 atom, fluorine-19, and phosphorous-31.

35. The method of any one of clauses 32-34, wherein the precursor further comprises at least a first carbon-12 atom covalently bonded to the first proton and a second carbon-12 atom covalently bonded to the first carbon-12 atom and to the second proton.

36. The method of any one of clauses 32-35, wherein the target atom is covalently bonded to a third proton.

37. The method of any one of clauses 32-36, wherein the first proton has a first Larmor frequency determined by the mean magnetic field strength, the second proton has a second Larmor frequency determined by the mean magnetic field strength, and the third proton has a third Larmor frequency determined by the mean magnetic field strength.

38. The method of clause 37, wherein a difference between the first and second Larmor frequencies, a difference between the first and third Larmor frequencies, or a difference between the second and third Larmor frequencies is less than twice the first J-coupling, twice the second J-coupling, or twice the third J-coupling.

39. The method of clause 37, wherein a difference between the first and second Larmor frequencies, a difference between the first and third Larmor frequencies, or a difference between the second and third Larmor frequencies is less than 20 Hertz (Hz).

40. The method of any one of clauses 32-39, wherein the precursor comprises a pyruvate ester containing at least one unsaturated bond, a precursor of fumarate containing at least one unsaturated bond, or a precursor of succinate containing at least one unsaturated bond.

41. The method of any one of clauses 32-40, wherein the MR pulse sequence comprises at least one radiofrequency (RF) waveform having a predetermined duration of at least 300 ms, and wherein the at least one RF waveform comprises one or more of: a frequency that is substantially constant during the duration, a frequency that varies substantially monotonously during the duration, an amplitude that is substantially constant during the duration, and an amplitude that varies substantially monotonously over the duration.

As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C. or A and B, or A and C, or B and C, or A and B and C.

What is claimed is:

1. A system for generating a hyperpolarized target compound, the system comprising:
   a hydrogenation device configured to generate a parahydrogenated solution by mixing a solvent, parahydrogen gas, and a precursor of the target compound, the precursor comprising an unsaturated chemical bond;
   a polarization device configured to generate a polarized solution containing the hyperpolarized target compound using the parahydrogenated solution, the polarization device comprising:
      (a) a polarization chamber configured to receive the parahydrogenated solution, the polarization chamber including a polarization region having a volume of at least 10 milliliters (mL);
      (b) one or more radiofrequency (RF) coils disposed around the polarization region of the polarization chamber; and
      (c) a magnetic field source disposed around the polarization region of the polarization chamber and configured to provide a mean magnetic field strength of at most 200 millitesla (mT);
   an RF waveform generator coupled to the one or more RF coils of the polarization device, the RF waveform generator configurable to apply a polarization transfer waveform to the one or more RF coils for a predetermined period of time, and wherein the polarization transfer RF waveform comprises at least one of:
      a frequency that is substantially constant during the period of time,
      a frequency that varies substantially linearly during the period of time,
      an amplitude that is substantially constant during the period of time, or
      an amplitude that varies substantially linearly over the period of time; and
   a purification system configured to separate a purified fraction from the polarized solution.

2. The system of claim 1, further comprising a dissolution chamber configured to contain the purified fraction and to receive a second solvent for dissolving the purified fraction.

3. The system of claim 1, wherein the polarization device comprises a magnetic shield, the magnetic shield disposed around the polarization region of the polarization chamber.

4. The system of claim 1, wherein the magnetic shield is configured to maintain a magnetic field strength within the polarization chamber at less than 200 mT during application of the polarization transfer waveform to the one or more RF coils.

5. The system of claim 1, wherein the hydrogenation device comprises a bubbler configured to introduce the parahydrogen gas into the solvent; a membrane configured to enable diffusion of the parahydrogen gas into the solvent; or an aerosolizer configured to spray droplets of the solvent into a parahydrogen chamber configured to receive the parahydrogen gas.

6. The system of claim 1, wherein the precursor of the target compound comprises the target compound chemically coupled to a sidearm containing the unsaturated chemical bond.

7. The system of claim 6, wherein the precursor of the target compound comprises an ester of the target compound.

8. The system of claim 6, wherein the purification system is configured to receive a cleavage solution configured to cleave the sidearm from the precursor of the target compound, thereby generating the target compound.

9. The system of claim 1, wherein the purification system comprises a separation system, wherein the purified fraction of the polarized solution comprises a precipitated fraction of the polarized solution, and wherein the separation system is configured to separate the precipitated fraction of the hyperpolarized target compound from the polarized solution.

10. The system of claim 9, wherein the dissolution chamber is configured to contain the precipitated fraction and to receive a second solvent for dissolving the precipitated fraction.

11. A method of generating a hyperpolarized target compound, the method comprising:
   using a hydrogenation device to generate a parahydrogenated solution by mixing a solvent, parahydrogen gas, and a precursor of the target compound, the precursor comprising an unsaturated chemical bond;
   using a polarization device to generate a polarized solution containing the hyperpolarized target compound using the parahydrogenated solution, the polarization device comprising:
      (a) polarization chamber configured to receive the parahydrogenated solution, the polarization chamber including a polarization region having a volume of at least 10 milliliters (mL);
      (b) one or more radiofrequency (FR) coils disposed around the polarization region of the polarization chamber; and
      (c) a magnetic field source disposed around the polarization region of the polarization chamber and configured to provide a mean magnetic field strength of at most 200 millitesla (mT);
   using an RF waveform generator coupled to the one or more RF coils of the polarization device to apply a polarization transfer waveform to the one or more RF coils for a predetermined period of time, and wherein the polarization transfer waveform comprises at least one of:
      a frequency that is substantially constant during the period of time,
      a frequency that varies substantially linearly during the period of time, an amplitude that is substantially constant during the period of time, or an amplitude that varies substantially linearly over the period of time; and using a purification system to separate a purified fraction from the polarized solution.

12. The method of claim 11, further comprising using a dissolution chamber to contain the purified fraction and to receive a second solvent for dissolving the purified fraction.

13. The method of claim 11, wherein the polarization device comprises a magnetic shield, the magnetic shield disposed around the polarization region of the polarization chamber.

14. The method of claim 11, further comprising using the magnetic shield to maintain a magnetic field strength within the polarization chamber at less than 200 mT during application of the polarization transfer waveform to the one or more RF coils.

15. The method of claim 11, wherein the hydrogenation device comprises a bubbler, a membrane, or an aerosolizer; and wherein the method further comprises using the bubbler to introduce the parahydrogen gas into the solvent, using the membrane to enable diffusion of the parahydrogen gas into the solvent, or using the aerosolizer to spray droplets of the solvent into a parahydrogen chamber configured to receive the parahydrogen gas.

16. The method of claim 11, wherein the precursor of the target compound comprises the target compound chemically coupled to a sidearm containing the unsaturated chemical bond.

17. The method of claim 11, wherein the precursor of the target compound comprises an ester of the target compound.

18. The method of claim 17, further comprising using the purification system to receive a cleavage solution to thereby cleave the sidearm from the precursor of the target compound, thereby generating the hyperpolarized target compound.

19. The method of claim 11, wherein the purification system comprises a separation system, wherein the purified fraction of the polarized solution comprises a precipitated fraction of the polarized solution, and wherein the method further comprises using the separation system to separate the precipitated fraction of the hyperpolarized target compound from the polarized solution.

20. The method of claim 19, further comprising using the dissolution chamber to contain the precipitated fraction and to receive a second solvent for dissolving the precipitated fraction.

* * * * *